United States Patent
Chang et al.

(10) Patent No.: US 12,243,787 B2
(45) Date of Patent: Mar. 4, 2025

(54) METHOD OF FORMING TESTING MODULE AND METHOD FOR USING THE SAME

(71) Applicant: TAIWAN SEMICONDUCTOR MANUFACTURING COMPANY, LTD., Hsinchu (TW)

(72) Inventors: Jen-Yuan Chang, Hsinchu (TW); Kong-Beng Thei, Hsinchu County (TW); Jung-Hui Kao, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 395 days.

(21) Appl. No.: 17/724,928

(22) Filed: Apr. 20, 2022

(65) Prior Publication Data
US 2023/0343653 A1    Oct. 26, 2023

(51) Int. Cl.
*H01L 21/78*      (2006.01)
*G01R 31/28*     (2006.01)
*H01L 21/66*      (2006.01)
*H01L 21/768*    (2006.01)

(52) U.S. Cl.
CPC .......... *H01L 22/14* (2013.01); *G01R 31/2887* (2013.01); *H01L 21/768* (2013.01); *H01L 21/78* (2013.01)

(58) Field of Classification Search
CPC ....... H01L 21/66; H01L 21/768; H01L 21/78; H01L 21/304; H01L 22/14; H01L 22/34; H01L 22/32; H01L 22/12; G03F 7/20; G03F 7/70633; G03F 7/70616; G03F 7/705; G03F 7/7065; G01R 1/06705; G01R 1/07392; G01R 1/07342; G01R 1/07314; G01R 19/25; G01R 19/16566; G01R 19/0084; G01R 19/0038; G01R 31/2887; G01R 31/28; G01R 31/2884
See application file for complete search history.

*Primary Examiner* — Nikolay K Yushin
(74) *Attorney, Agent, or Firm* — Birch, Stewart, Kolasch & Birch, LLP

(57) ABSTRACT

A method includes forming an integrated circuit and a testing pattern over a die region of a wafer and a scribe line region of the wafer, respectively, in which the integrated circuit and the testing pattern are formed by a same fabrication process; connecting a via of a testing chip to a testing pad of the testing pattern; performing a testing process to the die region by detecting electrical properties of the testing pattern through the testing chip; after the testing process is completed, forming an interconnection structure over the integrated circuit, in which the interconnection structure includes conductive features electrically connected to the integrated circuit; and after the interconnection structure is formed over the integrated circuit performing an singulation process through the scribe line region of the wafer, such that the die region of the wafer is singulated into an individual die.

20 Claims, 27 Drawing Sheets

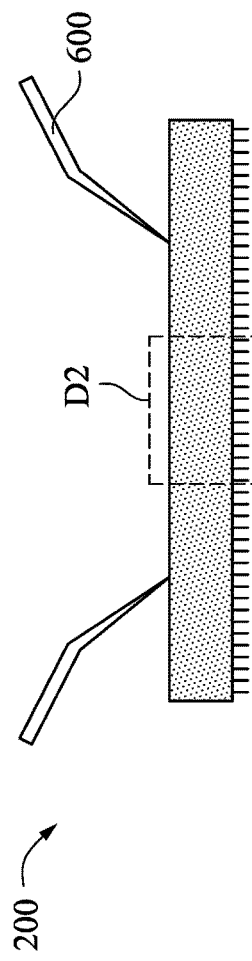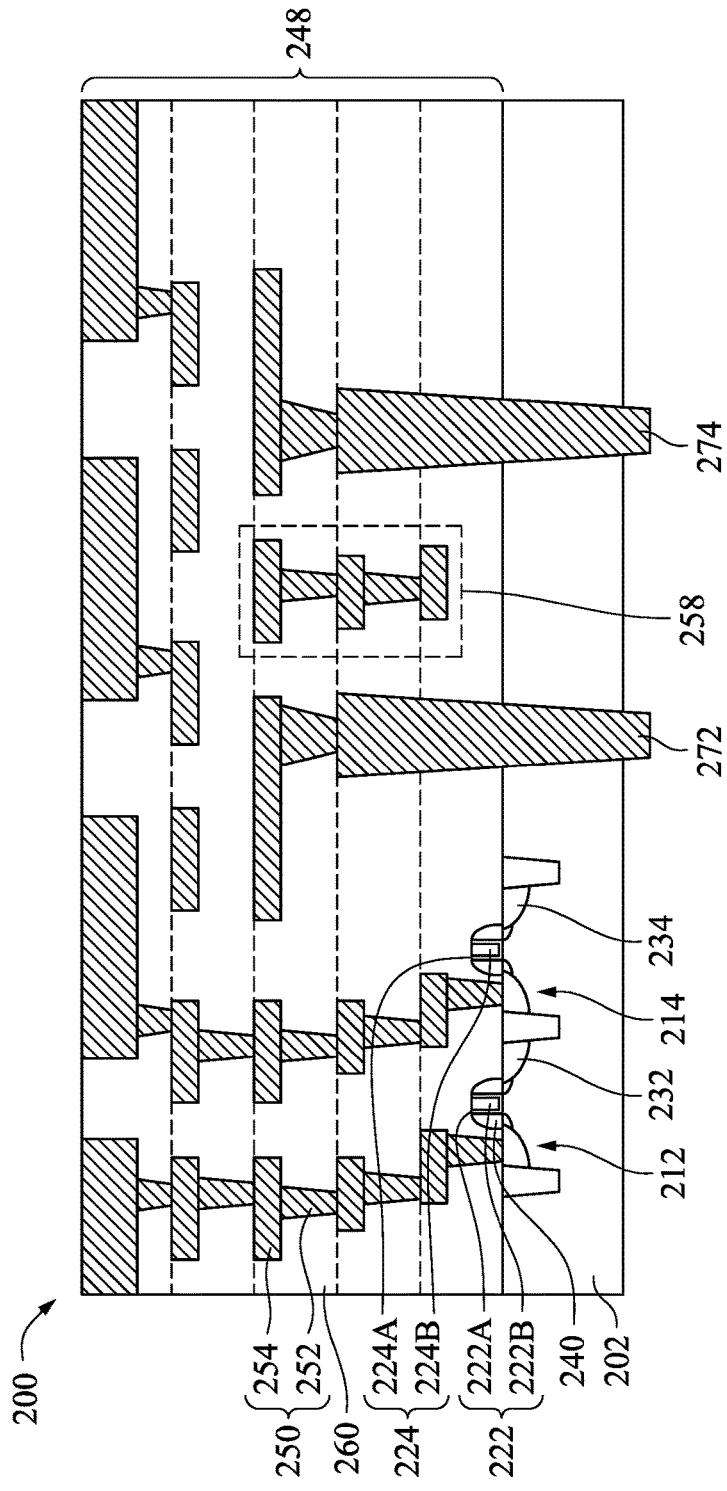
Fig. 4A
Fig. 4B

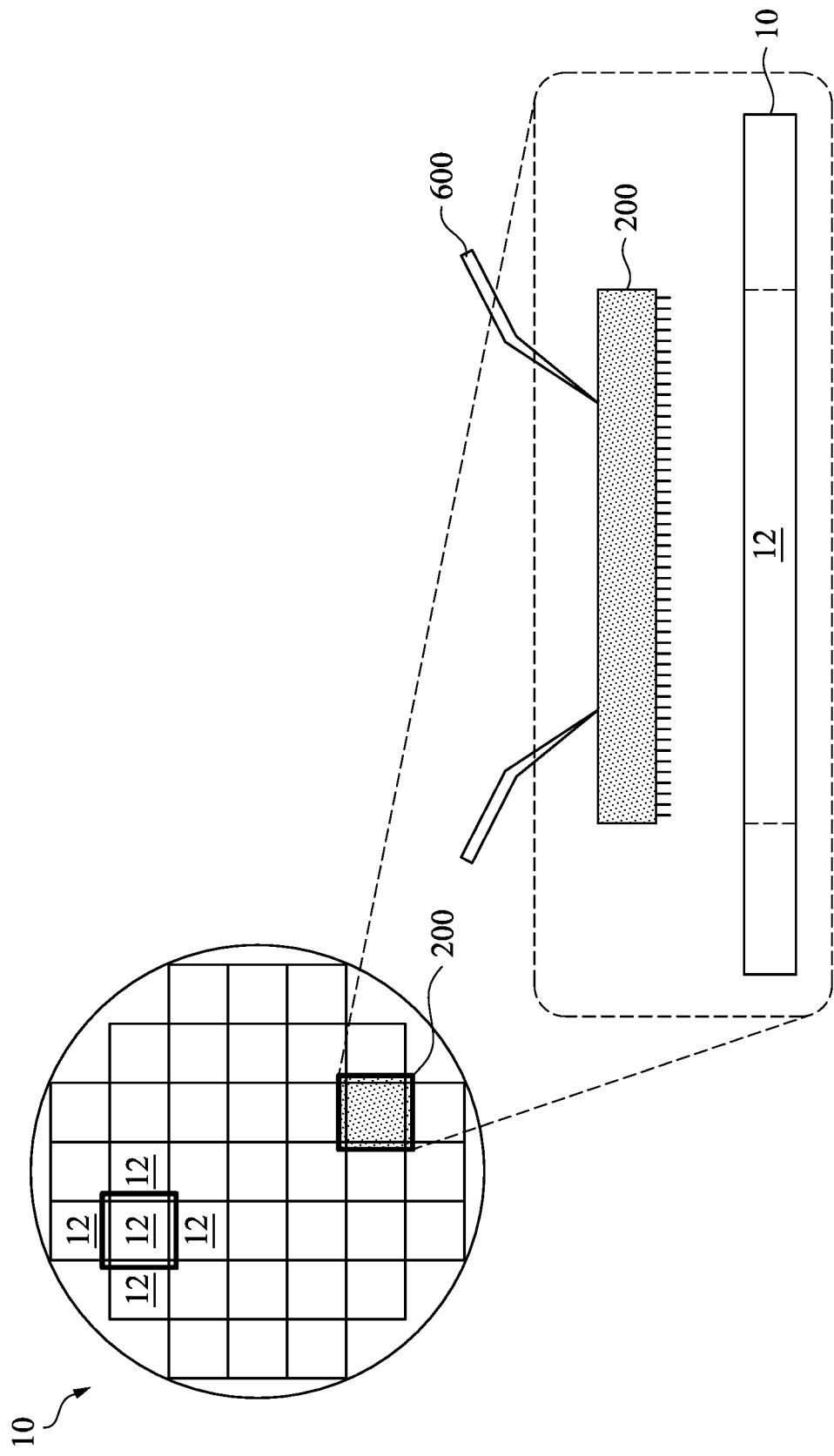

METHOD OF FORMING TESTING MODULE AND METHOD FOR USING THE SAME

BACKGROUND

As technologies evolve, design and manufacturing of semiconductor devices become more complicated in view of smaller dimensions, increased functionality and more complicated circuitries. Numerous manufacturing operations are implemented within such small and high-performance semiconductor devices. Therefore, there is a continuous need to modify the structure and method of testing and manufacturing for the semiconductor devices in order to improve device robustness as well as reduce manufacturing cost and processing time.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A is a schematic view of a testing module in accordance with some embodiments of the present disclosure.

FIGS. 4B to 4D are cross-sectional views of testing modules in accordance with some embodiments of the present disclosure.

FIG. 8 is a schematic view of using a testing module in accordance with some embodiments of the present disclosure.

DETAILED DESCRIPTION

Figure 1B:
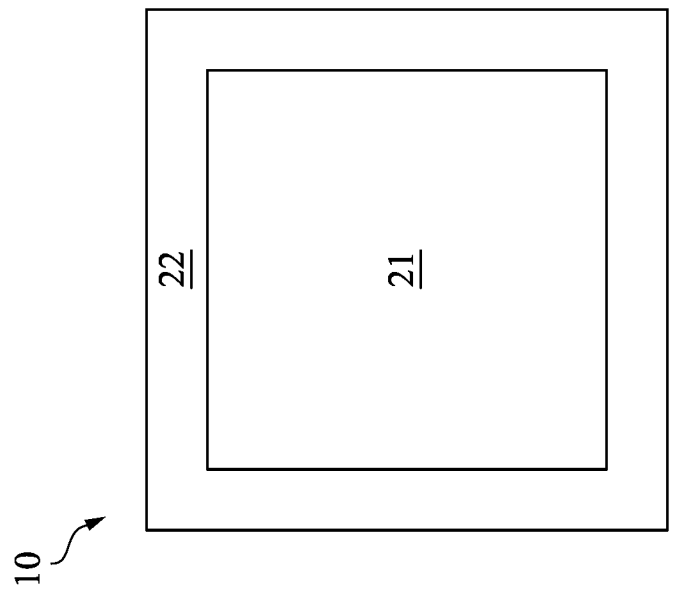
FIG. 1B illustrates a top schematic view of a mask in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1A:
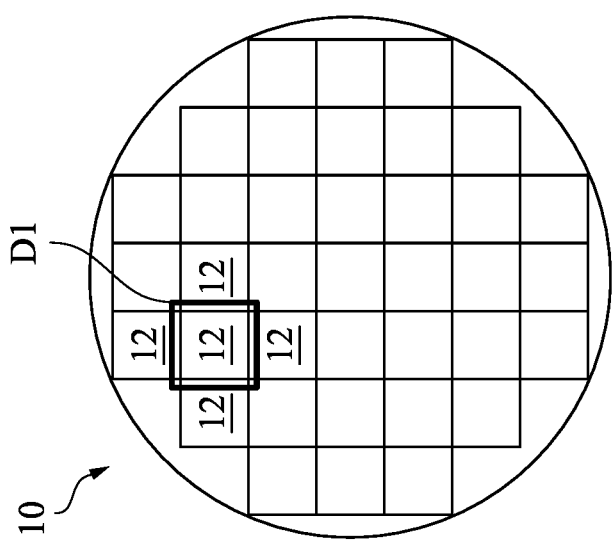
FIG. 1A illustrates a top schematic view of a wafer in accordance with some embodiments of the present disclosure.

FIG. 1A illustrates a top schematic view of a wafer in accordance with some embodiments of the present disclosure. FIG. 1B illustrates a top schematic view of a mask in accordance with some embodiments of the present disclosure.

Reference is made to FIG. 1A. Shown there is a semiconductor wafer 10. The semiconductor wafer 10 may be held by a wafer holder or a chuck during processing the semiconductor wafer 10. In some embodiments, the semiconductor wafer 10 includes a semiconductor material, such as silicon. In other embodiments, the semiconductor wafer 10 may include other semiconductor materials, such as silicon germanium, silicon carbide, gallium arsenide, or the like. In some embodiments, the semiconductor wafer 100 may be a p-type semiconductor substrate (acceptor type) or an n-type semiconductor substrate (donor type).

Reference is made to FIG. 1B. Shown there is a mask 20. In some embodiments, the mask 20 is a reflective mask. For example, the mask 20 includes a mask image region 21 and a mask frame region 22. The mask image region 21 is an area of the mask 20 that includes a pattern (or design) of a layer of an integrated circuit device. The mask frame region 22 is an area of the mask 20 that does not include the pattern of the layer of the integrated circuit device. The mask frame region 22 may include alignment marks (also referred to as fiducial marks). The mask frame region 22 surrounds the mask image region 21, defining the mask image region 21 of the mask 20.

The mask 20 is used to transfer the pattern of the mask image region 21 to a wafer, such as the wafer 10 as shown in FIG. 1A. In some embodiments where the mask 20 is a phase shift mask, the mask 20 may include absorptive regions, which absorb light incident thereon, and reflective regions, which reflect light incident thereon. The reflective regions can be configured to reflect light incident thereon with a phase different than light reflected by the reflective regions, such that resolution and image quality of the pattern transferred to the wafer 10 can be enhanced. The reflective and absorptive regions of the mask 20 are patterned such that light reflected from the reflective regions (and, in some cases, the absorptive regions) projects onto the wafer 10 and transfers the pattern of the mask image region 21 of the mask 20 to the wafer 10. For example, during an exposure process, light (radiation) is projected onto the mask 20, and a portion of the light is transmitted to the wafer 10, thereby transferring the pattern of the mask image region 21 to the wafer 10. In some embodiments, the wafer 10 is exposed to extreme ultraviolet (EUV) radiation (light) using the mask 20.

The mask image region 21 can be transferred to the wafer 10 multiple times using multiple exposures with the mask 20. For example, as shown in FIG. 1A, the mask 20 of FIG. 1B is used in multiple exposure processes to pattern the wafer 10, such that the pattern of the mask image region 21 is transferred to various fields 12 of the wafer 10. Each field 12 corresponds to at least one chip or die. Here, the field 12 can also be referred to as an exposure field, which represents an area of the wafer 10 that will undergo each exposure process in a given time. For example, an exposure tool (such as a stepper or a scanner) processes one field (such as exposing a field 12 of the wafer 10 by the mask 20), then processes the next field (such as exposing another field 12 of the wafer 10 by the mask 20), and so on. In some embodiments, the wafer 10 may include a resist layer disposed over a substrate, where the pattern of the mask image region 21 is transferred to the resist layer.

Figure 1D:
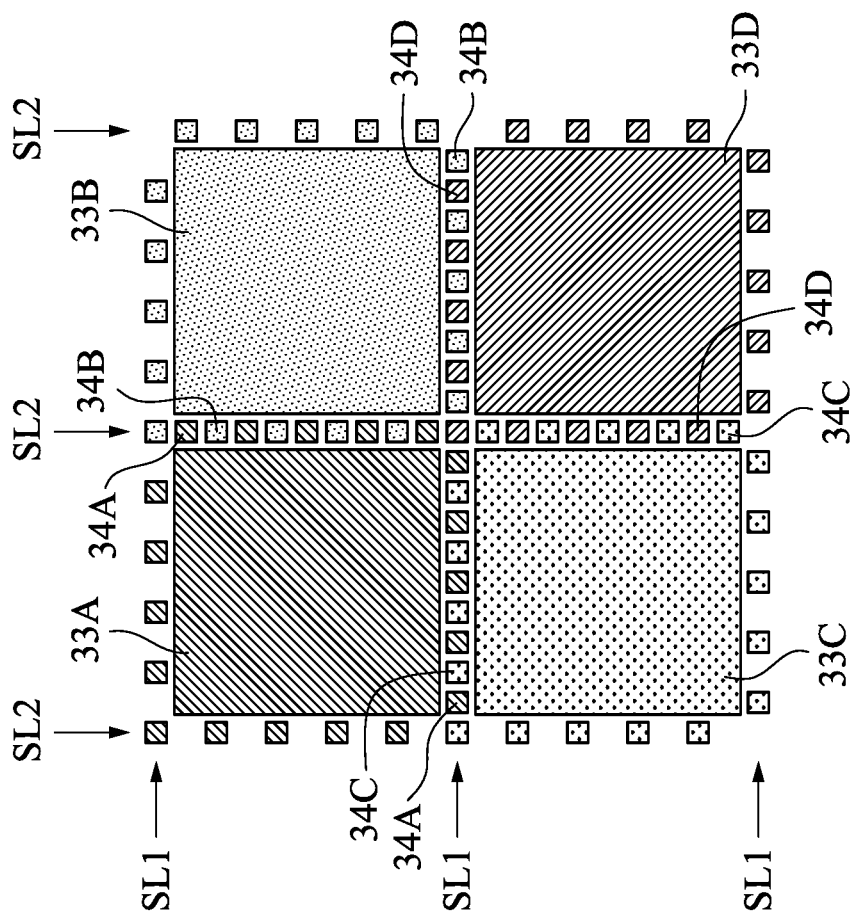
FIG. 1D is an enlarged view of region D1 as shown in FIG. 1A in accordance with some embodiments of the present disclosure.
Figure 1C:
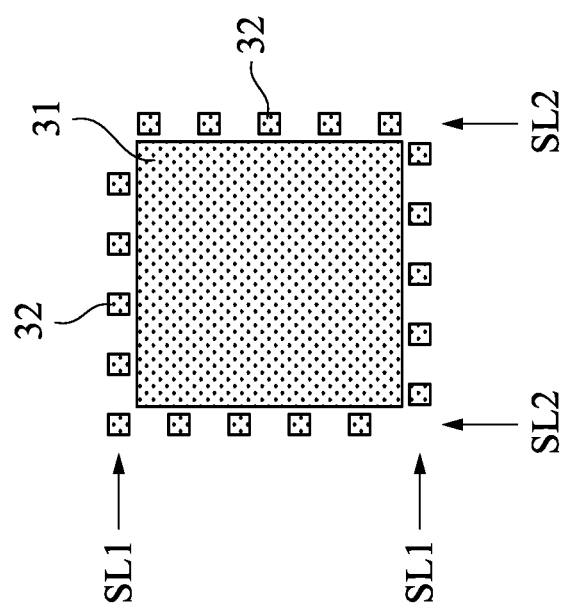
FIG. 1C is an enlarged view of region D1 as shown in FIG. 1A in accordance with some embodiments of the present disclosure.

FIG. 1C is a schematic view of field 12 of FIG. 1A in accordance with some embodiments of the present disclosure. In greater details, FIG. 1C is an enlarged view of region D1 as shown in FIG. 1A. In some embodiments, each field 12 includes one die region 31 (or chip region 31). The area of each die region 31 is defined by a plurality of first scribe line regions SL1 and second scribe line regions SL2. In some embodiments, the first scribe line regions SL1 extend along a first direction and the second scribe line regions SL2 extend along a second direction that is perpendicular to the first direction. After the fabrication and testing processes for the die region 31 are completed, the die region 31 will be singulated into individual die through the first scribe line regions SL1 and the second scribe line regions SL2.

A plurality of testing pads 32 are formed on the wafer 10 in the first scribe line regions SL1 and second scribe line regions SL2, and surround the die region 31. Here, the testing pads 32 may be exposed conductive pads of topmost layer of testing patterns, which will be discussed later. In some embodiments, during the semiconductor fabrication process, every processing step is performed across the wafer 10, so that testing pattern, which is made by the same processes as those for fabricating the semiconductor devices (or integrated circuits) in the die region 31, are also formed in the first scribe line regions SL1 and the second scribe line regions SL2. Because the fabrication instructions and environments for forming the semiconductor devices in the die region 31 and the testing pattern are nearly the same, a defect found in the testing pattern is likely to be found in the semiconductor devices in the die region 31. As a result, the testing pattern is suitable for serving as an indicator of the fabricating process condition before a thorough testing is conducted. The design parameters of the testing pattern may be determined as reflecting the electrical performance of the semiconductor devices in the die region 31 fabricated on the wafer 10.

FIG. 1D is a schematic view of field 12 of FIG. 1A in accordance with some embodiments of the present disclosure. In greater details, FIG. 1D is an enlarged view of region D1 as shown in FIG. 1A. FIG. 1D is different from FIG. 1C, in that each field 12 includes a plurality of die regions 33A, 33B, 33C, 33D. For example, shown there are four die regions 33A, 33B, 33C, 33D arranged in a 2×2 matrix. However, the number of die regions 33 in each field 12 is not limited thereto. Each field 12 may include more or less die regions in other embodiments. In some embodiments, the die regions 33A, 33B, 33C, 33D may be the same, or may be different. For example, the die regions 33A, 33B, 33C, 33D may include the same semiconductor devices having the same circuit function, or may include different same semiconductor devices with different circuit functions. The die regions 33A, 33B, 33C, 33D in each field 12 are separated by a plurality of first scribe line regions SL1 and second scribe line regions SL2. In some embodiments, the first scribe line regions SL1 extend along a first direction and the second scribe line regions SL2 extend along a second direction that is perpendicular to the first direction. After the fabrication and testing processes for the die regions 33A, 33B, 33C, 33D are completed, the die regions 33A, 33B, 33C, 33D will be singulated into individual dies through the first scribe line regions SL1 and the second scribe line regions SL2.

A plurality of testing pads 34A, 34B, 34C, 34D are formed on the wafer 10 in the first scribe line regions SL1 and second scribe line regions SL2, and surround the die regions 33A, 33B, 33C, 33D, respectively. For example, the testing pads 34A are disposed in the first scribe line regions SL1 and second scribe line regions SL2 and surround the die regions 33A, the testing pads 34B are disposed in the first scribe line regions SL1 and second scribe line regions SL2 and surround the die regions 33B, the testing pads 34C are disposed in the first scribe line regions SL1 and second scribe line regions SL2 and surround the die regions 33C, and the testing pads 34D are disposed in the first scribe line regions SL1 and second scribe line regions SL2 and surround the die regions 33D.

With respect to the segment of the first scribe line region SL1 between the die regions 33A and 33C, testing pads 34A and 34C are alternately arranged in the first direction along the segment of the first scribe line region SL1 between the die regions 33A and 33C. With respect to the segment of the first scribe line region SL1 between the die regions 33B and 33D, testing pads 34B and 34D are alternately arranged in the first direction along the segment of the first scribe line region SL1 between the die regions 33B and 33D.

On the other hand, with respect to the segment of the second scribe line region SL2 between the die regions 33A and 33B, testing pads 34A and 34B are alternately arranged in the second direction along the segment of the second scribe line region SL2 between the die regions 33A and 33B. With respect to the segment of the second scribe line region SL2 between the die regions 33C and 33D, testing pads 34A and 34B are alternately arranged in the second direction along the segment of the second scribe line region SL2 between the die regions 33C and 33D.

As mentioned above, the die regions 33A, 33B, 33C, and 33D may include different semiconductor devices with different circuit functions. Furthermore, the testing pads 34A, 34B, 34C, and 34D are exposed conductive pads of the testing patterns associated with the die regions 33A, 33B, 33C, and 33D. In some embodiments, during the semiconductor fabrication process, every processing step is performed across the wafer 10, so that testing patterns, which are made by the same processes as those for fabricating the semiconductor devices (or integrated circuits) in the die regions 33A, 33B, 33C, and 33D, are also formed in the first scribe line regions SL1 and the second scribe line regions SL2. Because the fabrication instructions and environments for forming the semiconductor devices in the die regions 33A, 33B, 33C, and 33D and the corresponding testing patterns associated with the die regions 33A, 33B, 33C, and 33D are nearly the same, defects found in the testing patterns are likely to be found in the semiconductor devices in the die regions 33A, 33B, 33C, and 33D. As a result, the testing patterns are suitable for serving as indicators of the fabricating process condition before a thorough testing is conducted. The design parameters of the testing patterns associated with the die regions 33A, 33B, 33C, and 33D may be determined as reflecting the electrical performance of the semiconductor devices in the die regions 33A, 33B, 33C, and 33D fabricated on the wafer 10.

Figure 2:
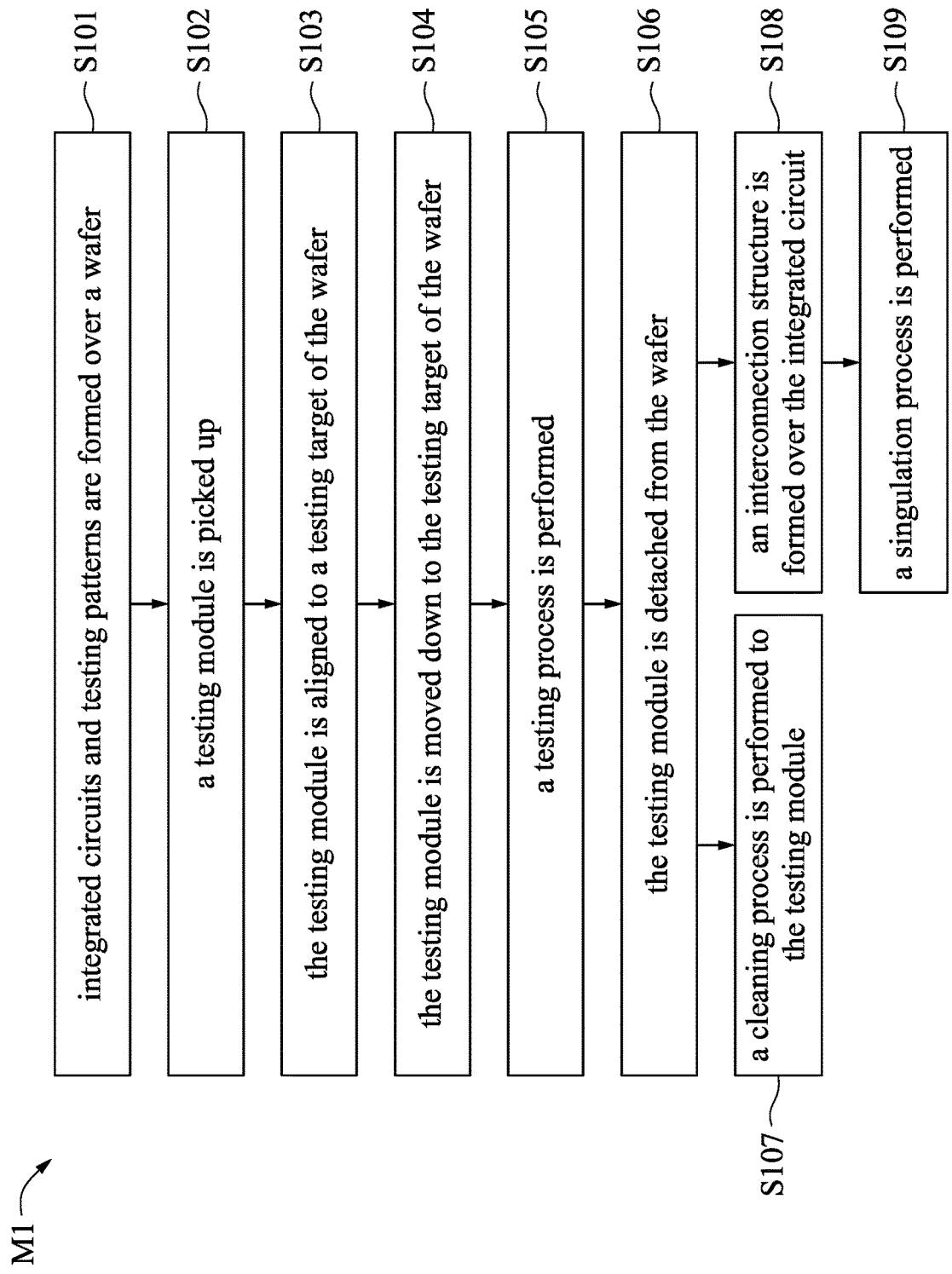
FIG. 2 illustrates a method in accordance with some embodiments of the present disclosure.

FIG. 2 illustrates a method M1 for testing a wafer in accordance with some embodiments of the present disclosure. Although the method M1 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

Figure 3:
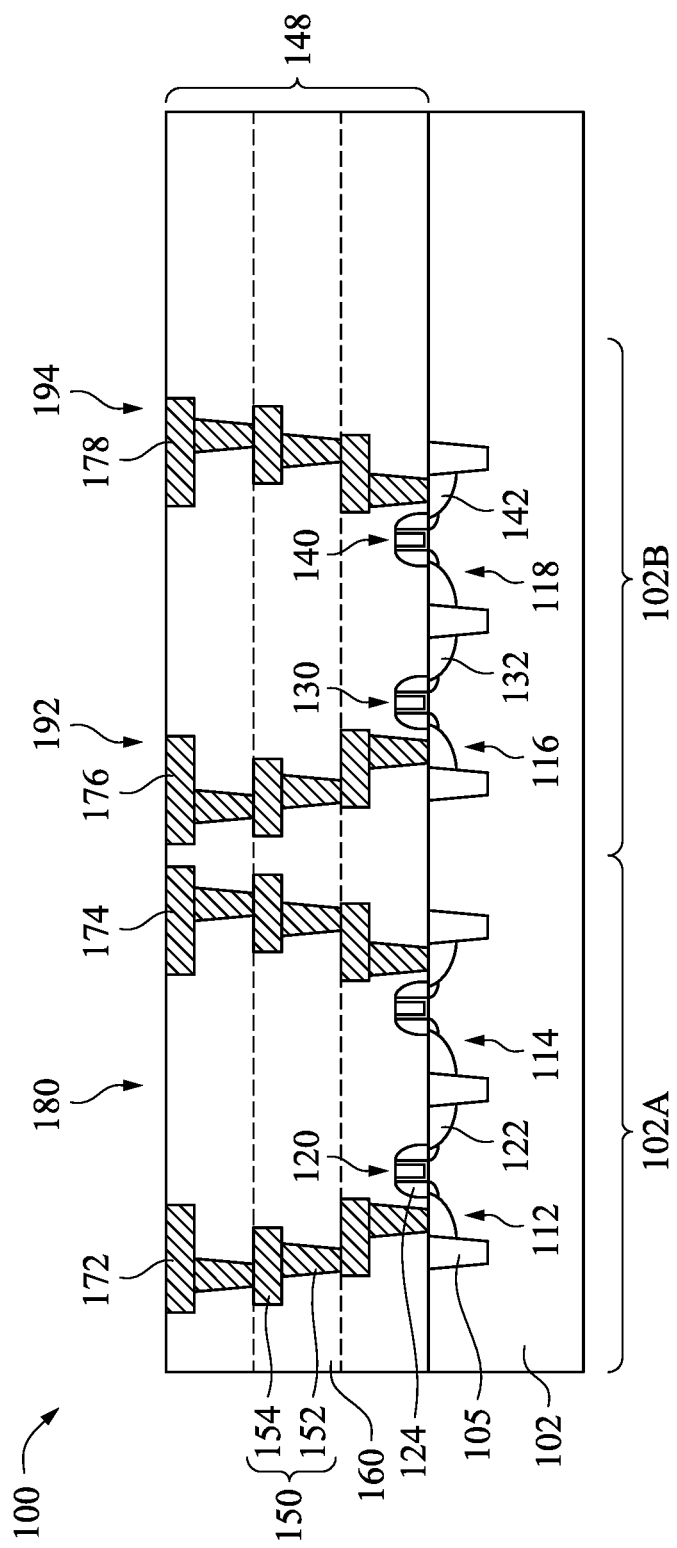
FIG. 3 is a cross-sectional view of a wafer in accordance with some embodiments of the present disclosure.

Reference is made to FIGS. 2 and 3. The method M1 begins at block S101, in which integrated circuits and testing patterns are formed over a wafer. As shown in FIG. 3, a wafer 100 is provided. The wafer 100 may be similar to the wafer 10 as discussed in FIGS. 1A to 1D. In some embodiments, the wafer 100 may include a substrate 102. Generally, the substrate 102 may include a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally include the crystalline semiconductor material silicon, but may include one or more other semiconductor materials such as germanium, silicon-germanium alloys, compound semiconductors (e.g., GaAs, AlAs, InAs, GaN, AlN, and the like), or their alloys (e.g., $Ga_xAl_{1-x}As$, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof. The semiconductor materials may be doped or undoped. Other substrates that may be used include multi-layered substrates, gradient substrates, or hybrid orientation substrates.

The layers and/or structures of the discussed below can be formed by several photolithography processes. In some embodiments, layers may be deposited blanket over the substrate 102, and then be patterned, for example, by using the mask 20 as discussed in FIG. 1B. For example, a material layer may be deposited over the substrate 102. Then, a photoresist is formed over the material layer. An exposure process is performed by projecting light (radiation) onto a mask (e.g., the mask 20 of FIG. 1B), and a portion of the light is transmitted to the photoresist. In some embodiments, the exposure process is performed to an exposure field (e.g., the field 12 of FIG. 1A) over the wafer once a time. After the exposure process performed to a field is completed, another exposure process is then performed to another field over the wafer. Once all fields over the wafer undergo the exposure processes, the photoresist across the wafer are exposed. The photoresist is then patterned based on the pattern transmitted from the mask via a development process. Afterwards, the material layer is etched by using the patterned photoresist as an etch mask. As a result, the pattern of the mask is transferred to the material layer.

Semiconductor devices 112 and 114 are formed over the substrate 102. Furthermore, testing semiconductor devices 116 and 118 are formed over the substrate 102. In some embodiments, the semiconductor devices 112 and 114 are formed over a die region 102A of the substrate 102, while the testing semiconductor devices 116 and 118 are formed over a scribe line region 102B over the substrate 102. Here, the die region 102A may be similar to the die region 31 as described in FIG. 1C, or may be similar to the die regions 33A to 33D as described in FIG. 1D. The scribe line region 102B may be similar to the scribe line regions SL1, SL2 as described in FIGS. 1C and 1D.

Isolation regions 105 are formed in the substrate 102. In some embodiments, the isolation regions may separate the semiconductor devices 112 and 114 from each other, and may separate the testing semiconductor devices 116 and 118 from each other. Each of the isolation regions 105 may be formed by recessing the substrate 102 to form trenches, and then depositing one or more dielectric materials (e.g., silicon oxide) to fill the trenches. The dielectric materials of the isolation regions 105 may be deposited using a high density plasma chemical vapor deposition (HDP-CVD), a low-pressure CVD (LPCVD), sub-atmospheric CVD (SACVD), a flowable CVD (FCVD), spin-on, and/or the like, or a combination thereof. After the deposition, an anneal process or a curing process may be performed.

In some embodiments, the semiconductor devices 112 and 114 each may include a gate structure 120 and source/drain regions 122 on opposite sides of the gate structure 120. On the other hand, the testing semiconductor device 116 includes a gate structure 130 and source/drain regions 132 on opposite sides of the gate structure 130. Furthermore, the testing semiconductor device 118 includes a gate structure 140 and source/drain regions 142 on opposite sides of the gate structure 140. Gate spacers 124 are formed on opposite sidewalls of the gate structures 120, 130, and 140, respectively.

In some embodiments, the gate structures 120, 130, and 140 are high-k, metal gate (HKMG) gate structures that may be formed using a gate-last process flow. In a gate last process flow, sacrificial dummy gate structures (not shown) is formed after forming the isolation regions 105. The dummy gate structures each may include a dummy gate dielectric, a dummy gate electrode, and a hard mask. First a dummy gate dielectric material (e.g., silicon oxide, silicon nitride, or the like) may be deposited. Next a dummy gate material (e.g., amorphous silicon, polycrystalline silicon, or the like) may be deposited over the dummy gate dielectric and then planarized (e.g., by CMP). A hard mask layer (e.g., silicon nitride, silicon carbide, or the like) may be formed over the dummy gate material. The dummy gate structures are then formed by patterning the hard mask and transferring that pattern to the dummy gate dielectric and dummy gate material using suitable photolithography and etching techniques. As described in greater detail below, the dummy gate structures may be replaced by the HKMG gate structures 120, 130, and 140, respectively. In some embodiments, the gate structures 120, 130, and 140 each may include a gate dielectric and a gate metal over the gate dielectric. The materials used to form the dummy gate structure and hard mask may be deposited using any suitable method such as CVD, plasma-enhanced CVD (PECVD), atomic layer deposition (ALD), plasma-enhanced ALD (PEALD) or the like, or by thermal oxidation of the semiconductor surface, or combinations thereof.

Gate spacers 124 may be formed by deposition and anisotropic etch of a spacer dielectric layer performed after the dummy gate patterning is complete. The spacer dielectric layer may include one or more dielectrics, such as silicon oxide, silicon nitride, silicon oxynitride, silicon carbide, silicon carbonitride, the like, or a combination thereof. The anisotropic etch process removes the spacer dielectric layer from over the top of the dummy gate structures leaving the spacers 124 along the sidewalls of the dummy gate structures.

Source and drain regions 122, 132, and 142 are semiconductor regions over the substrate 102. In some embodiments, the source and drain regions 122, 132, and 142 may be doped regions. Generally, the heavily-doped regions are spaced away from the dummy gate structures using the spacers 124, and may be formed, for example, by implanting dopants (e.g., As, P, B, In, or the like) using an ion implantation process. The source and drain regions 122, 132, and 142 may also be epitaxially grown regions. For example, after forming the spacers 124, the source and drain regions 122, 132, and 142 may be formed by first etching the substrate 102 to form recesses, and then depositing a crystalline semiconductor material in the recess by a selective epitaxial growth (SEG) process that may fill the recess. The crystalline semiconductor material may be elemental (e.g., Si, or Ge, or the like), or an alloy (e.g., $Si_{1-x}C_x$, or $Si_{1-x}Ge_x$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like.

Interconnection structure 148 is formed over the substrate 102 and over the semiconductor devices 112 and 114 and the testing semiconductor devices 116 and 118. The interconnect structure 148 may include one or more layers of conductive features 150 formed in one or more stacked dielectric layers 160. Each of the stacked dielectric layers 160 may include a dielectric material, such as a low-k dielectric material, an extra low-k (ELK) dielectric material, or the like. The dielectric layers 160 may be deposited using an appropriate process, such as, CVD, ALD, PVD, PECVD, or the like.

Conductive features 150 may include conductive lines 154 and conductive vias 152 interconnecting the layers of conductive lines 154. The conductive vias 152 may extend through respective ones of the dielectric layers 160 to provide vertical connections between layers of conductive lines 154. Here, the term "conductive vias" may be the structure in the conductive features 150 having longest dimensions extending vertically, and the term "conductive lines" may be the structure in the conductive features 150 having longest dimensions extending laterally. The conductive features 150 may be formed through any acceptable process, such as, a damascene process, a dual damascene process, or the like.

In some embodiments, the conductive lines 154 and the conductive vias 152 may be made of Al, Si, Cu, Ti, Ta, N, O, C, Ni, Co, W, or the like. In some embodiments, the dielectric layers 160 may be made of silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the dielectric layers 160 may include porous structure. In some embodiments, the dielectric layers 160 may include an etch stop layer made of SiN, SiCN, SiC, SiOCN, or the like.

For example, the conductive features 150 may be formed using a damascene process in which a respective dielectric layer 160 is patterned utilizing a combination of photolithography and etching techniques to form trenches corresponding to the desired pattern of the conductive features 150. An optional diffusion barrier and/or optional adhesion layer may be deposited and the trenches may then be filled with a conductive material. Suitable materials for the barrier layer includes titanium, titanium nitride, titanium oxide, tantalum, tantalum nitride, titanium oxide, or other alternatives, and suitable materials for the conductive material include copper, silver, gold, tungsten, aluminum, combinations thereof, or the like. In an embodiment, the conductive features 150 may be formed by depositing a seed layer of copper or a copper alloy, and filling the trenches by electroplating. A chemical mechanical planarization (CMP) process or the like may be used to remove excess conductive material from a surface of the respective dielectric layer 160 and to planarize the surface for subsequent processing.

In some embodiments, the topmost layer of the conductive lines 154 may include exposed conductive pads 172, 174, 176, and 178. For example, the conductive pad 172 is electrically connected to semiconductor device 112 through the underlying layers of the conductive features 150. The conductive pad 174 is electrically connected to semiconductor device 114 through the underlying layers of the conductive features 150. The conductive pad 176 is electrically connected to the testing semiconductor device 116 through the underlying layers of the conductive features 150. The conductive pad 178 is electrically connected to the testing semiconductor device 118 through the underlying layers of the conductive features 150.

In some embodiments, the semiconductor devices 112, 114, and their overlying conductive features 150 can be collectively referred to as an integrated circuit 180. The integrated circuit 180 is disposed within the die region 102A of the substrate 102. That is, after the manufacturing process, a singulation process may be performed to singulate the die region 102A of the substrate 102 into individual die through the scribe line region 102B of the substrate 102.

As mentioned above, the testing semiconductor devices 116 and 118 are formed in scribe line region 102B over the substrate 102 of the wafer 100. Furthermore, the fabrication instructions and environments for forming the semiconductor devices 112 and 114, and the testing semiconductor devices 116 and 118 are nearly the same, defects found in the semiconductor devices 112 and 114 are likely to be found in the testing semiconductor devices 116 and 118. As a result, during a testing process, the testing semiconductor devices 116 and 118 are suitable for serving as indicators of the fabricating process condition. The design parameters of the testing semiconductor devices 116 and 118 may be determined as reflecting the electrical performance of the semiconductor devices 112 and 114.

The conductive pads 176 and 178 are connected to the testing semiconductor devices 116 and 118, respectively, and the conductive pads 176 and 178 may be functioned as testing pads during a testing process discussed in following steps. Accordingly, the conductive pads 176 and 178 may also be referred to as testing pads 176 and 178, respectively. The testing semiconductor device 116 and its overlying conductive features 150, which include the conductive pad 176, may be collectively referred to as a testing pattern 192. Furthermore, the testing semiconductor device 118 and its overlying conductive features 150, which include the conductive pad 178, may be collectively referred to as a testing pattern 194. In some embodiments, the testing pads 176 and 178 may be similar to the testing pad 32 as described in FIG. 1C, or may be similar to the testing pads 34A-34D as described in FIG. 1D.

In some embodiments, the testing semiconductor devices 116 and 118 may be the same. That is, the testing semiconductor devices 116 and 118 may be formed with the same fabrication process as the semiconductor devices 112 and 114, and may include substantially the same electrical properties and/or electrical functionalities as the semiconductor devices 112 and 114. As a result, by performing a testing process to the testing semiconductor devices 116 and 118, the electrical performance of the semiconductor devices 112 and 114 can be determined.

However, in some other embodiments, the testing semiconductor devices 116 and 118 are different. For example, the testing semiconductor device 116 may be formed with the same fabrication process as the semiconductor devices 112 and 114 within the die region 102A of the substrate 102, and may include substantially the same electrical properties and/or electrical functionalities as the semiconductor devices 112 and 114. On the other hand, the testing semiconductor device 118 may be formed with a different fabrication process, which is used to fabricate other semiconductor devices within other die region of the substrate 102. As a result, the testing pad 176 may be associated with the semiconductor devices 112 and 114 within the die region 102A of the substrate 102, while the testing pad 178 may be associated with the other semiconductor devices within other die region of the substrate 102. For example, if the testing pad 176 is the testing pad 34A as described in FIG. 1D, the testing pad 178 may be one of the testing pads 34B, 34C, and 34D as described in FIG. 1D. Stated another way, the testing pads 176 and 178 are associated with different semiconductor devices.

Figure 4C:
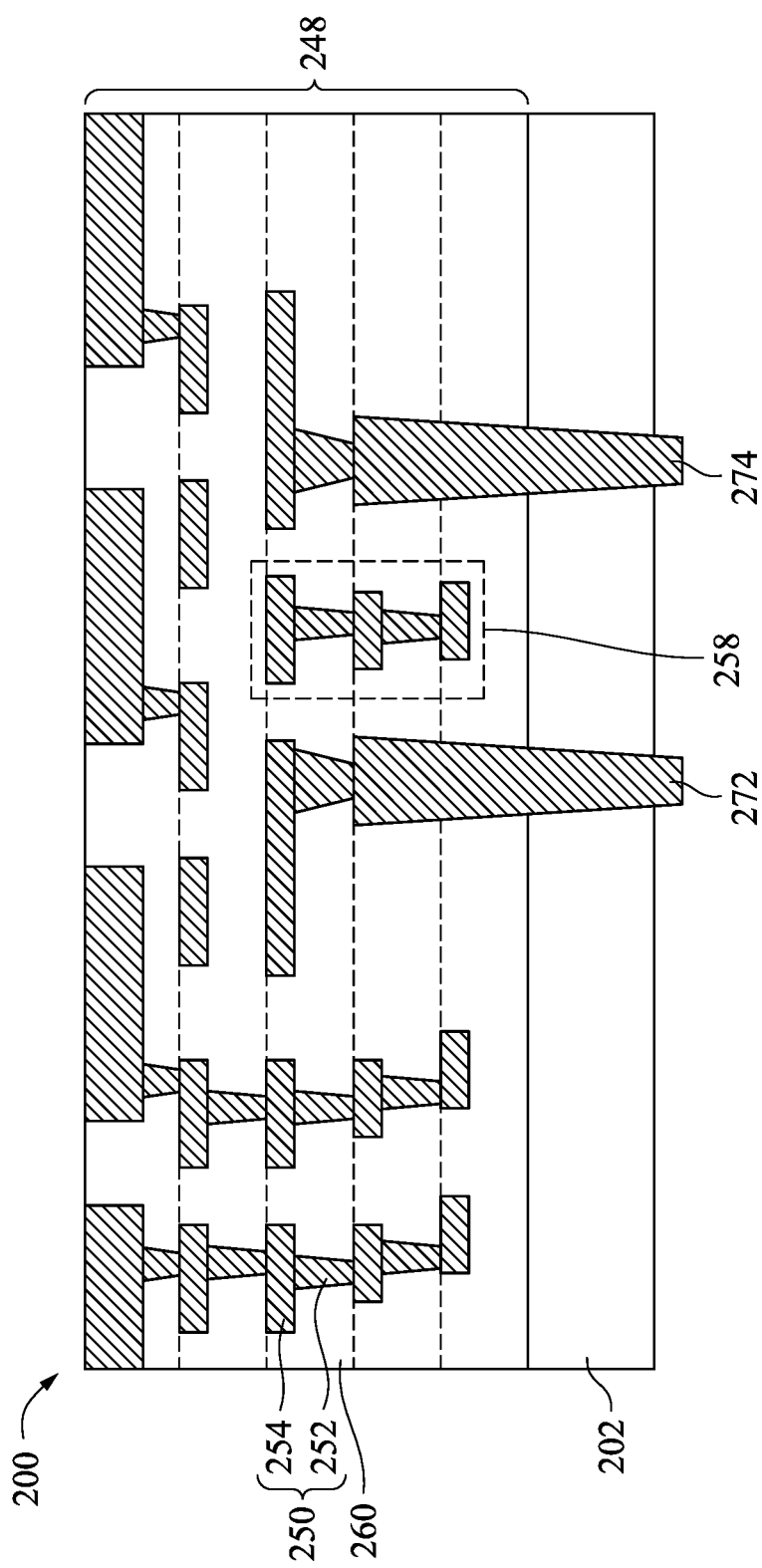
Figure 4D:
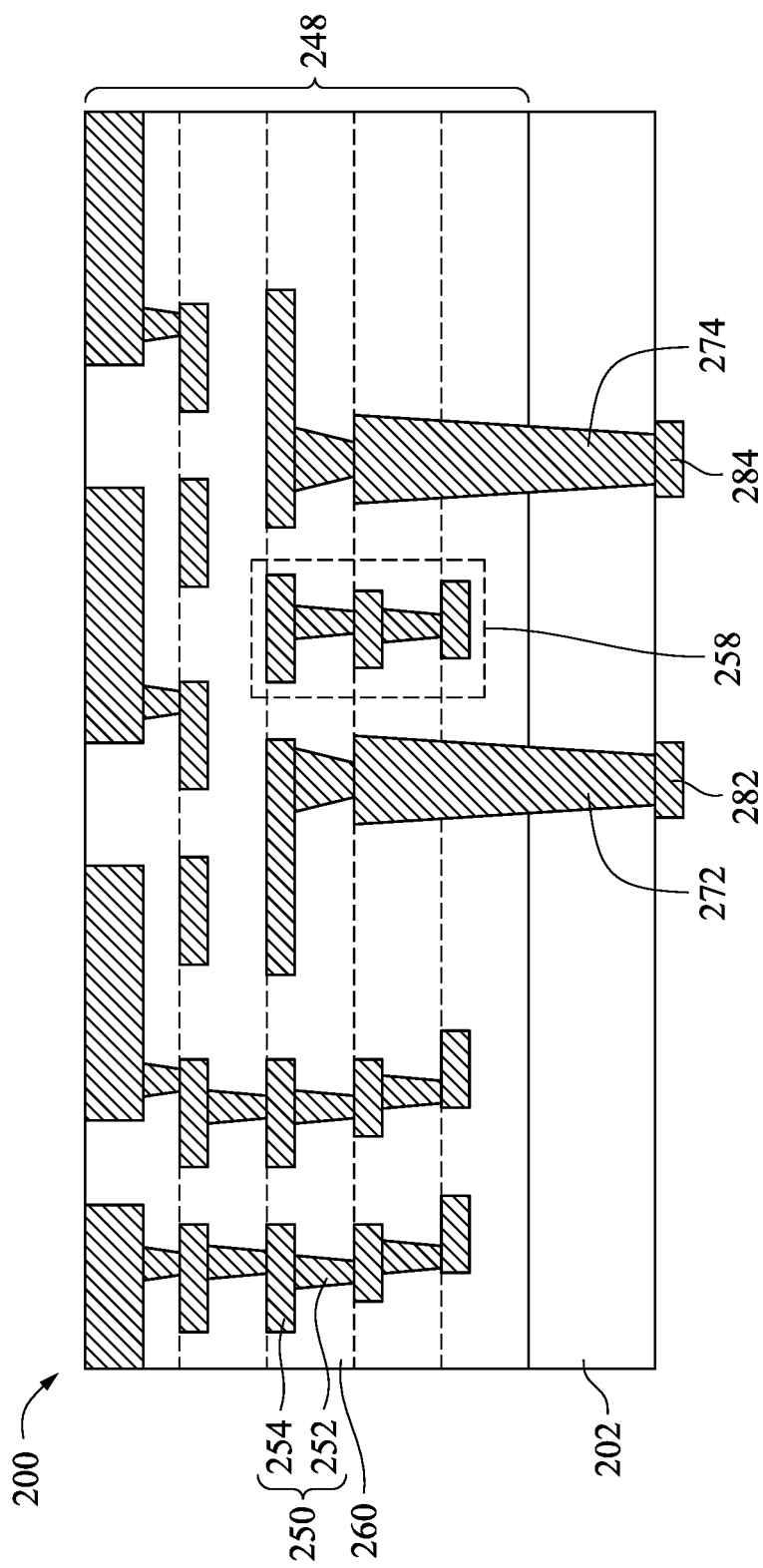

Referring back to FIG. 2, the method M1 proceeds to block S102, in which a testing module is picked up. Reference is made to FIG. 4A, shown there is a schematic view of a testing module 200. FIGS. 4B, 4C, and 4D are cross-sectional views of the testing module 200 in accordance with some embodiments of the present disclosure. In greater details, FIGS. 4B, 4C, and 4D illustrate different examples of cross-sectional views of region D2 of the testing module 200 of FIG. 4A.

The testing module 200 is picked up by a gripper 600. In some embodiments, the gripper 600 may include suitable type of effector used for grasping or holding an object, such as the testing module 200. For example, the effector may be a pressure gripper (e.g., gripping by applying pressure to an object, such as with a pincer type motion), an envelope gripper (e.g., gripping by surrounding an object to be manipulated), a vacuum gripper (e.g., gripping by suction force), and a magnetic gripper (e.g., gripping by use of electromagnetic forces).

In some embodiments, the testing module 200 is a die and/or a chip, and can also be referred to as a testing die and/or a testing chip, which is formed by a semiconductor fabrication process, and may include semiconductor materials. Reference is made to FIG. 4B. The testing module 200 may include a substrate 202. The substrate 202 may include a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally include the crystalline semiconductor material silicon, but may include one or more other semiconductor materials such as germanium, silicon-germanium alloys, compound semiconductors (e.g., GaAs, AlAs, InAs, GaN, AlN, and the like), or their alloys (e.g., $Ga_xAl_{1-x}As$, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof. The semiconductor materials may be doped or undoped. Other substrates that may be used include multi-layered substrates, gradient substrates, or hybrid orientation substrates. In some other embodiments, the substrate 202 may also include molding compound, polyimide, resin, composite insulation film, or the like.

The testing module 200 further includes a first semiconductor device 212 and a second semiconductor device 214 over the substrate 202. In some embodiments, the first semiconductor device 212 and the second semiconductor device 214 are transistors, and can also be referred to as a first transistor 212 and a second transistor 214, respectively. In some embodiments, the first semiconductor device 212 may be different from the second semiconductor device 214. For example, the first semiconductor device 212 may be an N-type device, while the second semiconductor device 214 may be a P-type device, and vice versa.

In some embodiments, the first semiconductor device 212 may include a gate structure 222 and source and drain regions 232 on opposite sides of the gate structure 222. The second semiconductor devices 214 may include a gate structure 224 and source and drain regions 234 on opposite sides of the gate structure 224. Gate spacers 240 are disposed on opposite sidewalls of the gate structures 222 and 224, respectively.

The gate structure 222 of the first semiconductor device 212 includes a gate dielectric 222A and a gate metal 222B over the gate dielectric 222A. Similarly, the gate structure 224 of the second semiconductor device 214 includes a gate dielectric 224A and a gate metal 224B over the gate dielectric 224A.

In some embodiments, the gate dielectrics 222A and 224A may include silicon oxide ($SiO_2$). In some embodiments, the gate dielectrics 222A and 224A may include high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials.

In some embodiments, the gate metals 222B and 224B may include a work function metal layer and a filling metal. The work function metal layer may be an n-type or p-type work function layer. Exemplary p-type work function metals include TiN, TaN, Ru, Mo, Al, WN, ZrSi$_2$, MoSi$_2$, TaSi$_2$, NiSi$_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The filling metal may include tungsten (W), aluminum (Al), copper (Cu), or another suitable conductive material(s).

In some embodiments, the gate spacers 240 may be formed of silicon oxide, silicon nitride, silicon oxynitride, combinations thereof. In some embodiments, the source and drain regions 232 and 234 may include Ge, Si, GaAs, AlGaAs, SiGe, GaAsP, SiP, or other suitable material, and may be doped with N-type dopants or P-type dopants. In some embodiments, the source/drain regions 232 and 234 are epitaxially grown over the substrate 202, and may also be referred to as source/drain epitaxial structures.

Although the embodiments of FIG. 4B illustrate one first semiconductor device 212 and one second semiconductor device 214, the present disclosure is not limited thereto. In some other embodiments, the testing module 200 may include a plurality of first semiconductor devices 212 and a plurality of second semiconductor devices 214. In such embodiments, the group of the first semiconductor devices 212 may collectively perform a certain function, while the group of the second semiconductor devices 214 may collectively perform a certain function.

The testing module 200 further includes an interconnection structure 248 over the substrate 202, and over the first semiconductor device 212 and the second semiconductor device 214. The interconnect structure 248 may include one or more layers of conductive features 250 formed in one or more stacked dielectric layers 260. Each of the stacked dielectric layers 260 may include a dielectric material, such as a low-k dielectric material, an extra low-k (ELK) dielectric material, or the like.

Conductive features 250 may include conductive lines 254 and conductive vias 252 interconnecting the layers of conductive lines 254. The conductive vias 252 may extend through respective ones of the dielectric layers 260 to provide vertical connections between layers of conductive lines 254. In some embodiments, the conductive lines 254 and the conductive vias 252 may be made of Al, Si, Cu, Ti, Ta, N, O, C, Ni, Co, W, or the like. In some embodiments, the dielectric layers 260 may be made of silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the dielectric layers 260 may include porous structure. In some embodiments, the dielectric layers 260 may include an etch stop layer made of SiN, SiCN, SiC, SiOCN, or the like.

The testing module 200 further includes a plurality of conductive vias 272 and 274 extending through the substrate 202. In some embodiments where the substrate 202 is made of silicon, the vias 272 and 274 can be referred to as through-silicon-vias (TSVs). The vias 272 and 274 extend into the interconnection structure 248, and may be in contact with corresponding conductive vias 254 of the conductive features 250. In some other embodiments, the vias 272 and 274 may be in contact with corresponding conductive lines 252 of the conductive features 250. In some embodiments, the vias 272 and 274 may be made of Al, Si, Cu, Ti, Ta, N, O, C, Ni, Co, W, or the like.

In some embodiments, the width of the conductive vias 272 and 274 may be in a range from about 3 μm to about 40 μm. In some embodiments, the conductive vias 272 and 274 may include circular top-view profiles, and the diameter of the conductive vias 272 and 274 may be in a range from about 3 μm to about 40 μm.

The vias 272 and 274 have top surfaces higher than the top surface of the gate structure 222 of the first semiconductor device 212 and the top surface of the gate structure 222 of the first semiconductor device 212. The vias 272 and 274 protrude from the bottom surface of the substrate 202. That is, the bottom surfaces of the vias 272 and 274 are lower than the bottom surface of the substrate 202. Furthermore, the top surfaces of the vias 272 and 274 are higher than the top surface of the substrate 202.

The testing module 200 further includes a guard ring structure 258. In some embodiments, the guard ring structure 258 is a portion of the conductive features 250 that is laterally between the conductive vias 272 and 274. For example, the guard ring structure 258 includes a plurality of conductive lines 254 and conductive vias 242 interconnecting the layers of conductive lines 254. The guard ring structure 258 can prevent crosstalk issue between the conductive vias 272 and 274. In some embodiments, the bottommost surface of the guard ring structure 258 is higher than the top surface of the substrate 202, and is higher than the bottom surface of the conductive vias 272 and 274.

Reference is made to FIG. 4C. Some elements of FIG. 4C are similar to those of FIG. 4B, such elements are labeled the same, and thus relevant details will not be repeated for brevity. FIG. 4C is different from FIG. 4B, in that the first semiconductor device 212 and the second semiconductor device 214 of FIG. 4B are omitted in FIG. 4C. That is, the testing module of FIG. 4C is free of semiconductor devices (or transistors).

Reference is made to FIG. 4D. Some elements of FIG. 4D are similar to those of FIG. 4B, such elements are labeled the same, and thus relevant details will not be repeated for brevity. FIG. 4D is different from FIG. 4B, in that the bottom surfaces of the vias 272 and 274 are substantially level with the bottom surface of the substrate 202. Furthermore, the testing module of FIG. 4D includes conductive pads 282 and 284 disposed on the bottom surface of the substrate 202, and in contact with the vias 272 and 274, respectively. In some embodiments, the conductive pads 282 and 284 may be made of Al, Si, Cu, Ti, Ta, N, O, C, Ni, Co, W, or the like. Although semiconductor devices 212 and 214 of FIG. 4B are omitted in FIG. 4D, while the semiconductor devices 212 and 214 of FIG. 4B may also presents in the embodiments of FIG. 4D.

Figure 5A:
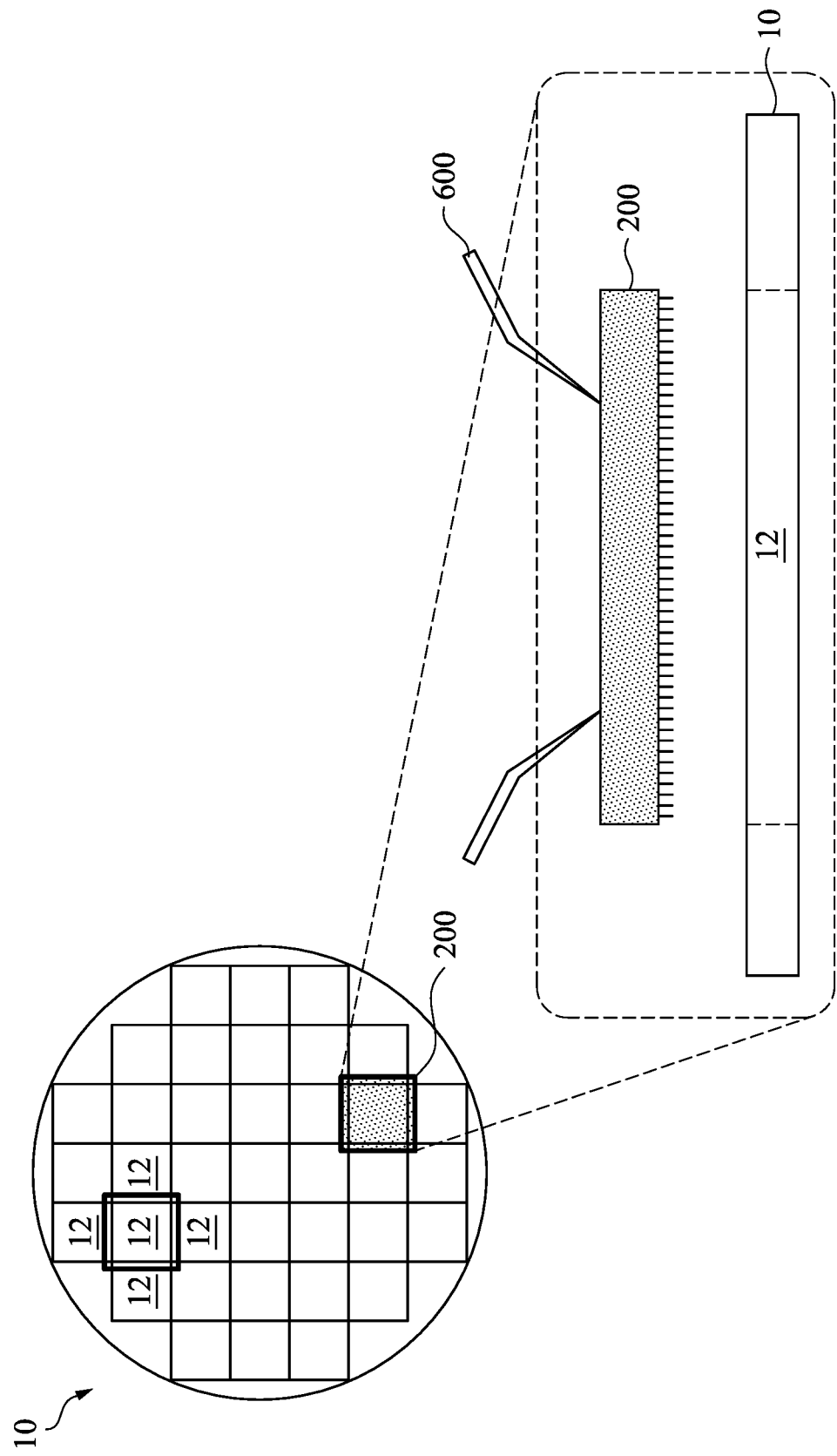
FIG. 5A is a schematic view of using a testing module in accordance with some embodiments of the present disclosure.

Referring back to FIG. 2, the method M1 proceeds to block S103, in which the testing module is aligned to a testing target of the wafer. Reference is made to FIG. 5A, the gripper 600 move the testing module 200 to a position above the wafer 10. Then, the testing module 200 is aligned to a testing target of the wafer 10. Here, the testing target may be the semiconductor devices (or integrated circuit) in a die region and testing pads of the testing patterns around the die region as described above. During the alignment process, the testing module 200 may be moved, by the gripper 600, to a position vertically overlaps the field 12 of the wafer 10. In such embodiments, the size (or area) of the testing module 200 may be substantially the same as the size (or area) the field 12 of the wafer 10, such that the testing module 200 can cover an entirety of the field 12 of the wafer 10. That is, the testing module 200 is aligned to a target field 12 of the wafer 10.

Reference is made to FIGS. 1A, 1C, and 5A. As discussed with respect to FIGS. 1A and 1C, each field 12 of the wafer 10 includes one die region 31. In such embodiments, the testing target is the die region 31 and the testing pads 32 surrounding the die region 31. Accordingly, the testing module 200 of FIG. 5A covers a field 12 of the wafer 10, which includes one die region 31 and testing pads 32 surrounding the die region 31. In some embodiments, the testing module 200 may cover an entirety of the die region 31 and the testing pads 32. In such embodiments, the size of the testing module 200 can cover only one die region 31. That is, the area of the testing module 200 may be slighter larger than the area of the die region 31, and may be less than two times the area of the die region 31.

Reference is made to FIGS. 1A, 1D, and 5A. As discussed with respect to FIGS. 1A and 1D, each field 12 of the wafer 10 includes die regions 33A, 33B, 33C, and 33D. In such embodiments, the testing target is the die regions 33A to 33D and the testing pads 34A to 34D surrounding the die regions 33A to 33D, respectively. Accordingly, the testing module 200 of FIG. 5A covers a field 12 of the wafer 10, which includes the die regions 33A to 33D and the testing pads 34A to 34D surrounding the die regions 33A to 33D. In some embodiments, the testing module 200 may cover an entirety of the die regions 33A, 33B, 33C, and 33D. In such embodiments, the size of the testing module 200 can cover more than one die regions.

Figure 5B:
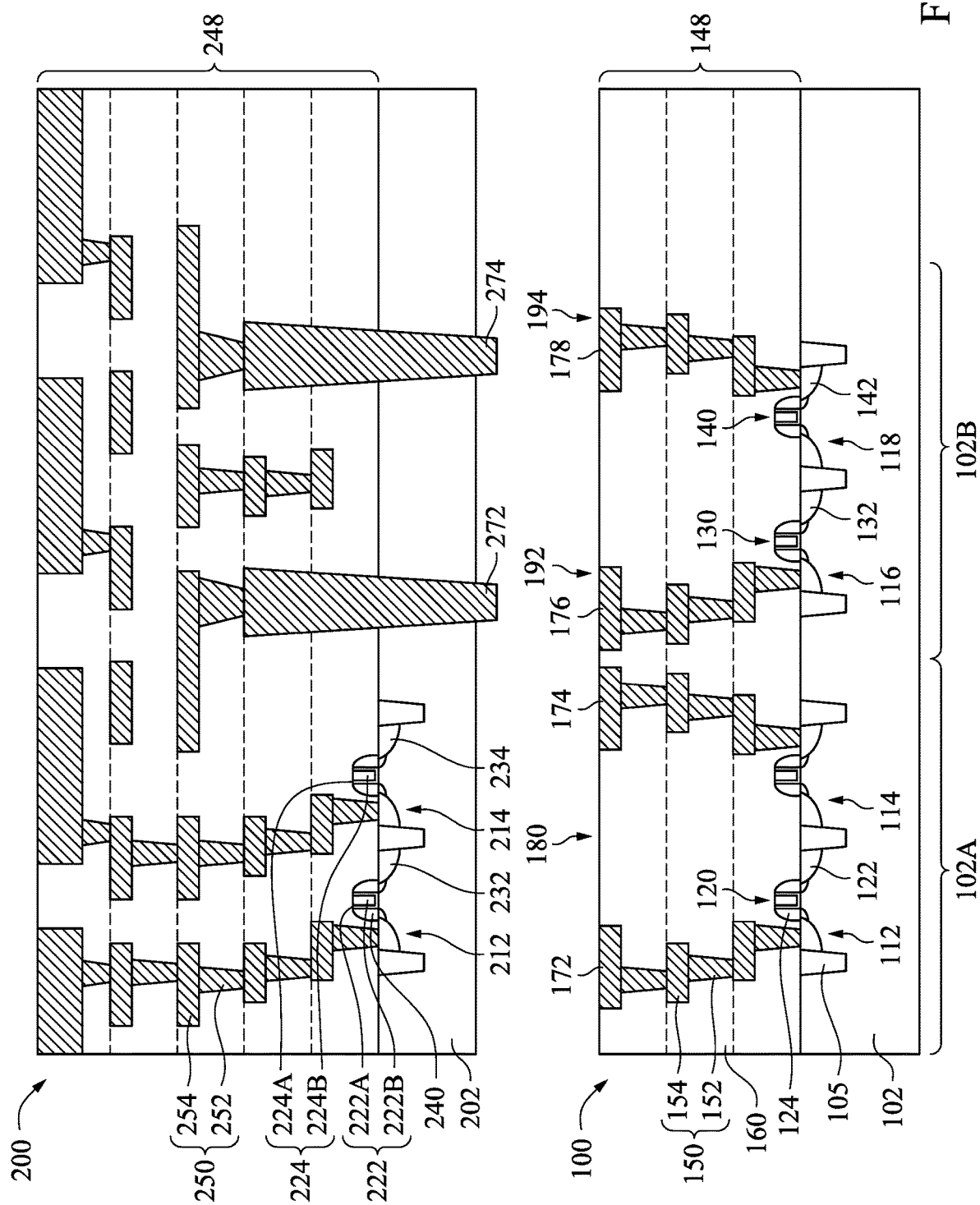
FIGS. 5B to 5D are cross-sectional views of wafers and testing modules in accordance with some embodiments of the present disclosure.

Reference is made to FIG. 5B. In greater details, the testing module 200 is aligned to the testing patterns 192 and 194 of the substrate 102. For example, the vias 272 and 274 are aligned with the testing pads 176 and 178, respectively. In some embodiments, the alignment process is performed such that the vias 272 and 274 are vertically above the scribe line region 102B of the substrate 102. In some embodiments, although the testing module 200 may vertically overlap the die region 102A of the substrate 102, the vias 272 and 274 do not vertically overlap the die region 102A of the substrate 102.

Figure 5C:
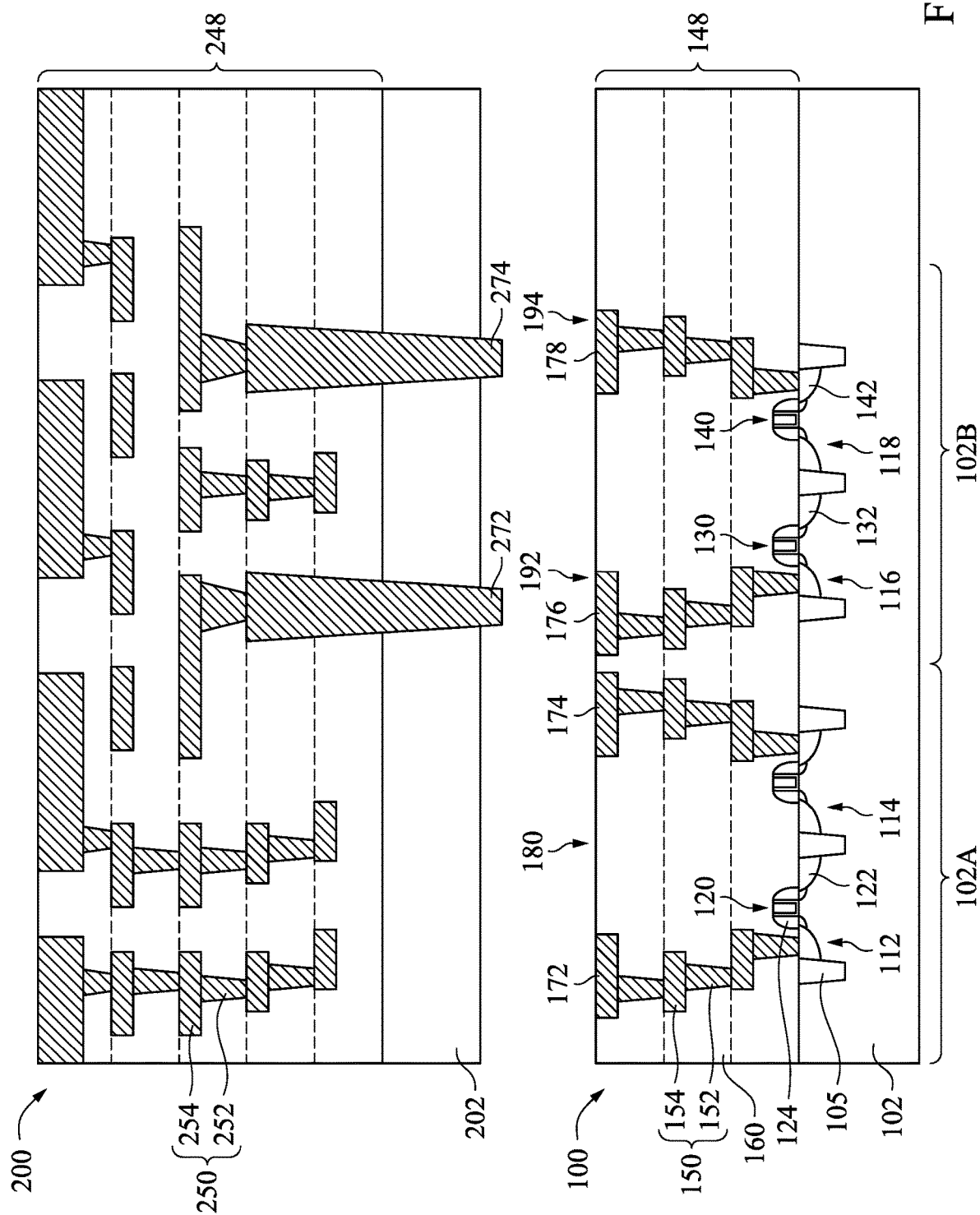

Reference is made to FIG. 5C. Some elements of FIG. 5C are similar to those of FIG. 5B, such elements are labeled the same, and thus relevant details will not be repeated for brevity. FIG. 5C is different from FIG. 5B, in that the first semiconductor device 212 and the second semiconductor device 214 of FIG. 5B are omitted in FIG. 4C.

Figure 5D:
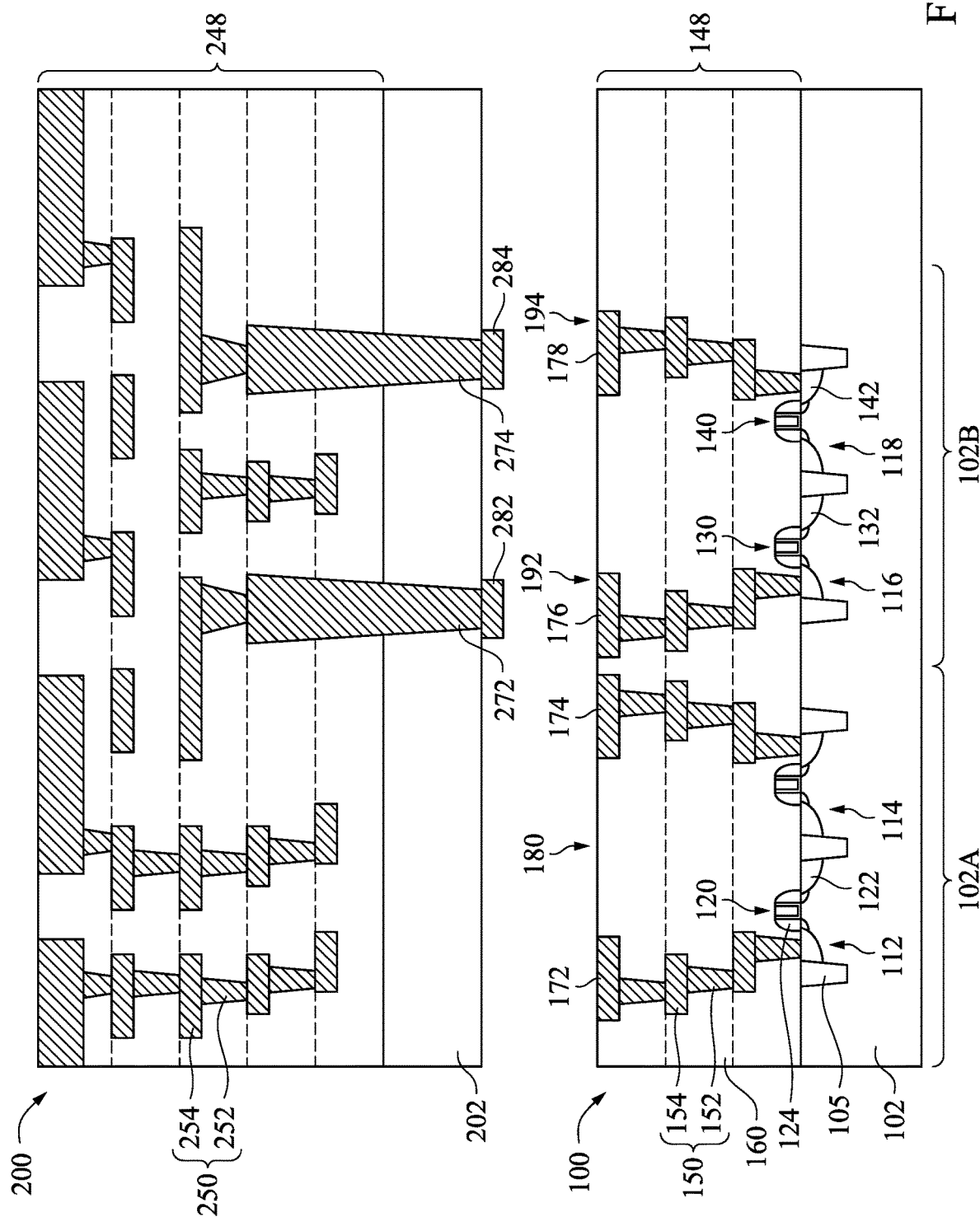

Reference is made to FIG. 5D. Some elements of FIG. 5D are similar to those of FIG. 5B, such elements are labeled the same, and thus relevant details will not be repeated for brevity. FIG. 5D is different from FIG. 5B, in that the conductive pads 282 and 284 are aligned with the conductive pads 176 and 178, respectively. In some embodiments, the alignment process is performed such that the conductive pads 282 and 284 are vertically above the scribe line region 102B of the substrate 102. In some embodiments, although the testing module 200 may vertically overlap the die region 102A of the substrate 102, the conductive pads 282 and 284 do not vertically overlap the die region 102A of the substrate 102.

Figure 6A:
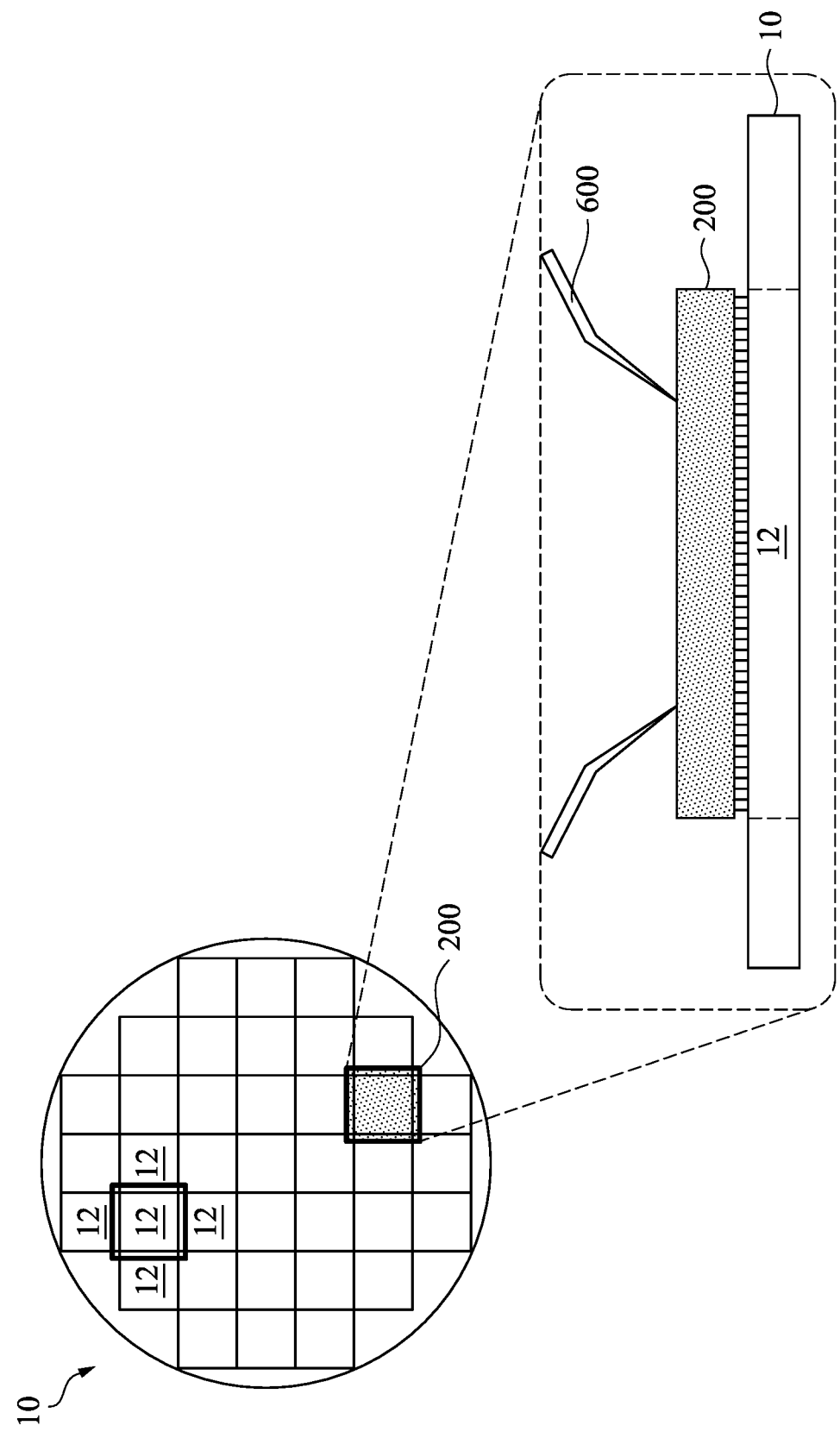
FIG. 6A is a schematic view of using a testing module in accordance with some embodiments of the present disclosure.

Referring back to FIG. 2, the method M1 proceeds to block S104, in which the testing module is moved down to the testing target of the wafer. Reference is made to FIG. 6A, the gripper 600 moves that the testing module 200 downwardly to the wafer 10, such that the testing module 200 is in contact with the wafer 10, and may be electrically connected to the testing target (e.g., testing pads of the testing patterns) of the wafer 10.

Figure 6B:
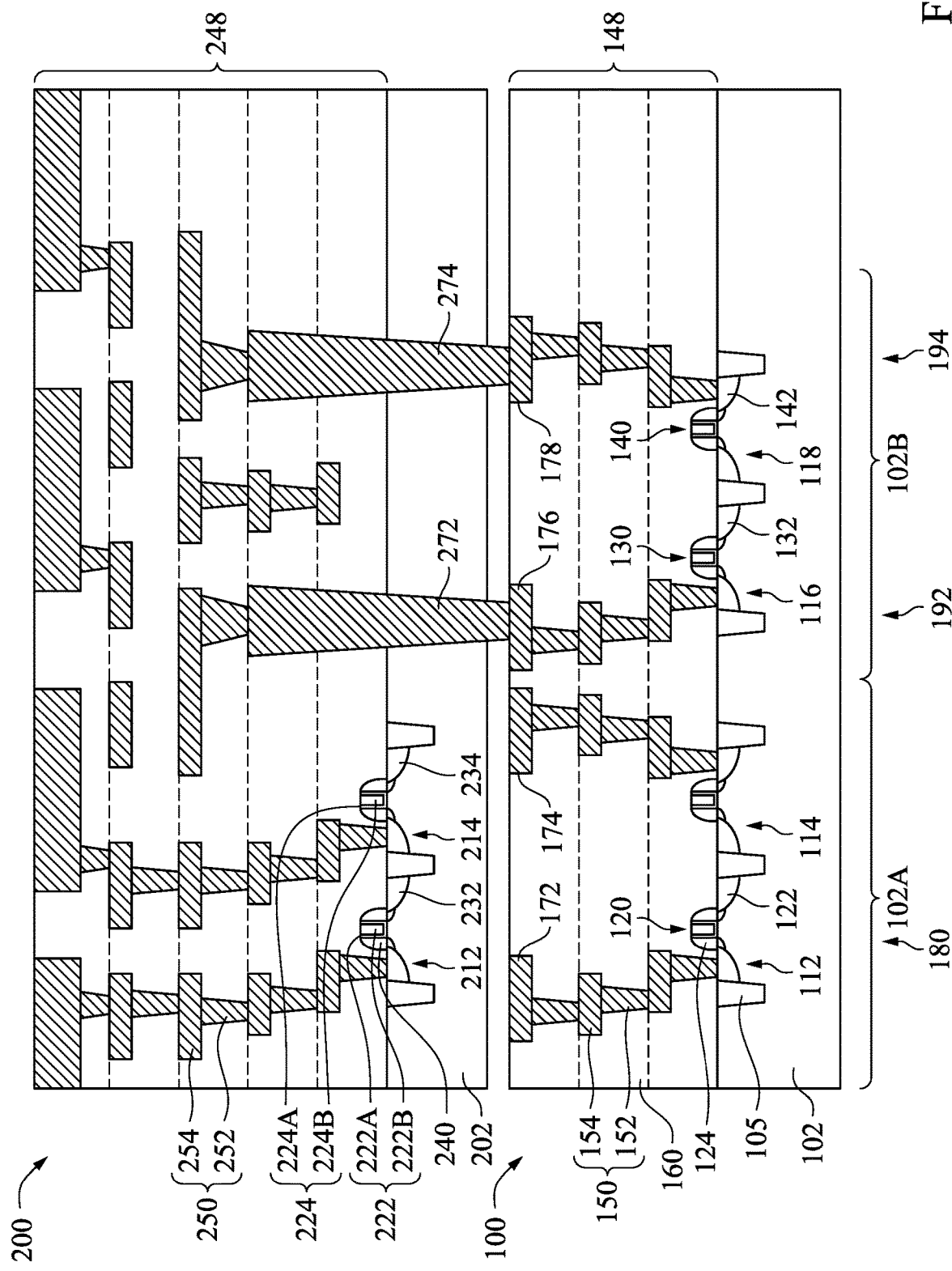
FIGS. 6B to 6D are cross-sectional views of wafers and testing modules in accordance with some embodiments of the present disclosure.

Reference is made to FIG. 6B. In greater details, the testing module 200 moved downwardly to the wafer 100, such that the vias 272 and 274 are in contact with the conductive pads 176 and 178, respectively. In some embodiments, the bottom surface of the substrate 202 of the testing module 200 is separated from the wafer 100.

Figure 6C:
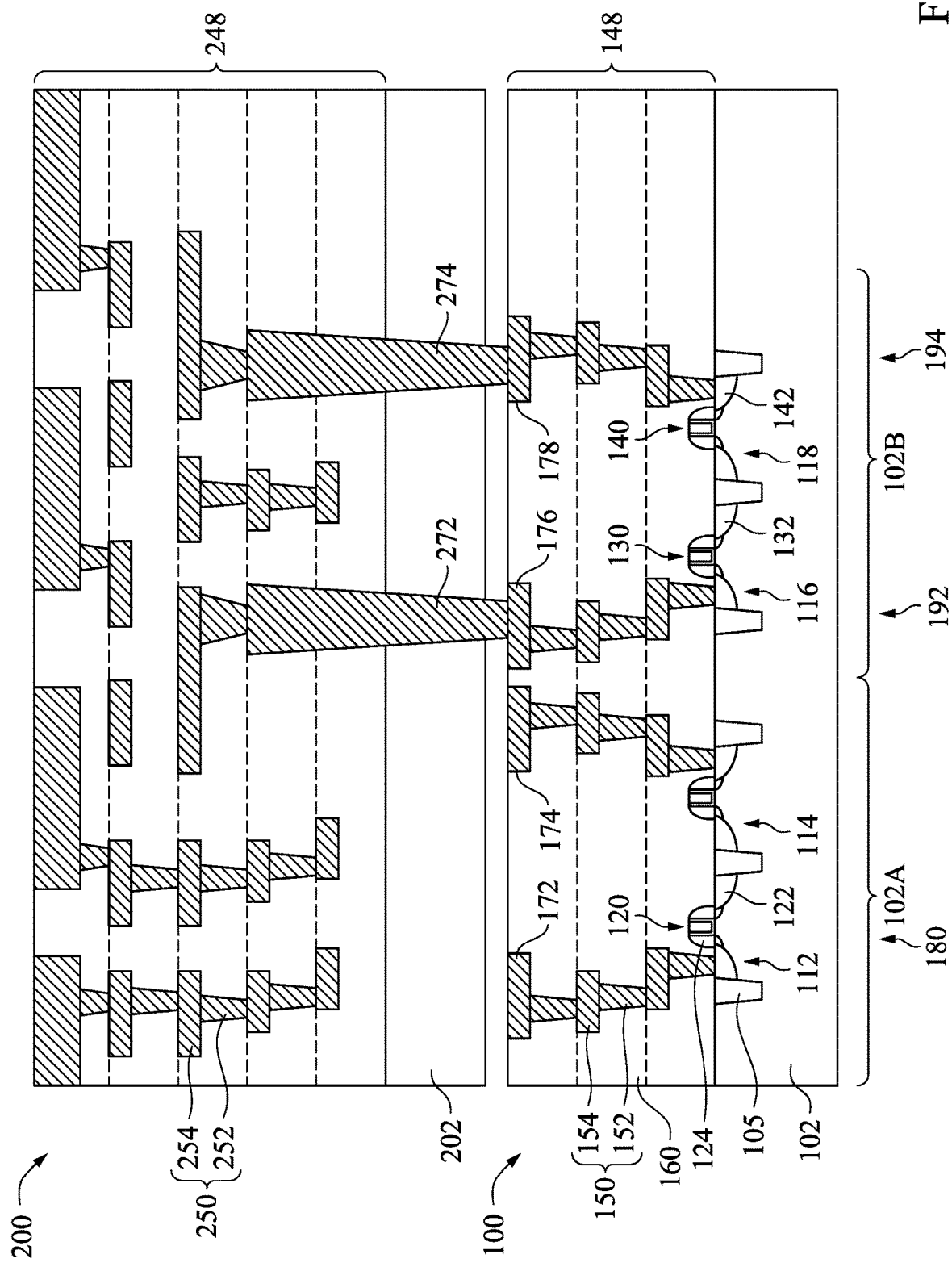

Reference is made to FIG. 6C. Some elements of FIG. 6C are similar to those of FIG. 6B, such elements are labeled the same, and thus relevant details will not be repeated for brevity. FIG. 6C is different from FIG. 6B, in that the first semiconductor device 212 and the second semiconductor device 214 of FIG. 6B are omitted in FIG. 6C.

Figure 6D:
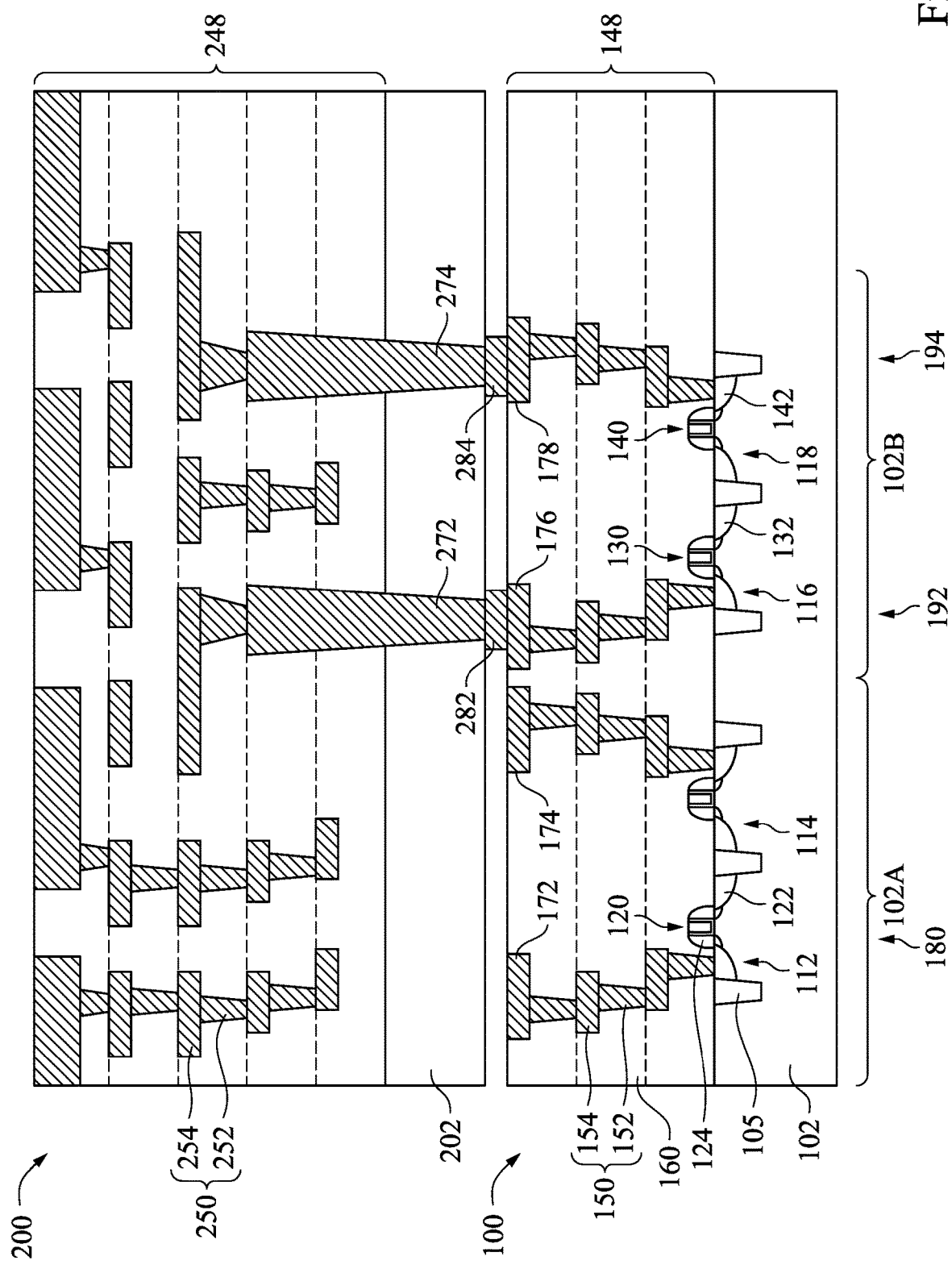

Reference is made to FIG. 6D. Some elements of FIG. 6D are similar to those of FIG. 6B, such elements are labeled the same, and thus relevant details will not be repeated for brevity. FIG. 6 D is different from FIG. 6B, in that the testing module 200 moved downwardly to the wafer 100, such that the conductive pads 282 and 284 are in contact with the conductive pads 176 and 178, respectively.

Figure 7A:
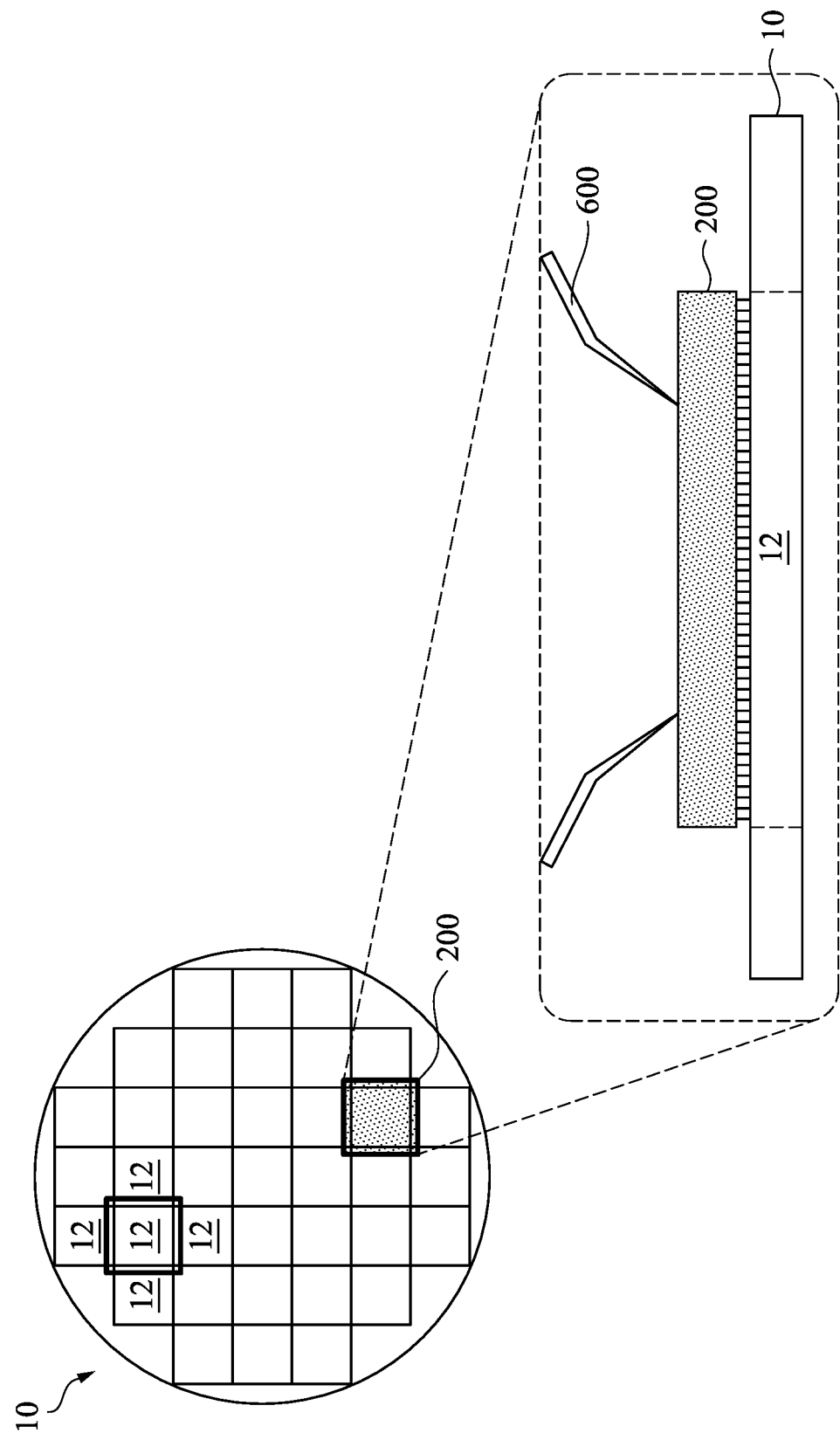
FIG. 7A is a schematic view of using a testing module in accordance with some embodiments of the present disclosure.

Referring back to FIG. 2, the method M1 proceeds to block S105, in which a testing process is performed. In some embodiments of FIG. 7A, the testing process may be a circuit probing (CP) test. For example, a probe (e.g., the conductive vias 272 and 274 of FIGS. 7B and 7C, or the conductive pads 282 and 284 of FIG. 7D) may be used to electrically couple to a testing pad (e.g., the testing pads 176, 178 of FIGS. 7B to 7D) of a wafer for die testing to check whether a die is a good die. In some embodiments, the testing pad of the testing pattern serves as an indicator to check whether the corresponding die is a good die. The die may be selected to test different electrical properties and/or electrical functionalities, such as leakage current, breakdown voltage, threshold voltage and effective channel length, saturation current, contact resistance and connections. That is, the testing results of the testing pattern can reflect the condition of the associated die. In some embodiments, if the die passes the CP test, the die may be referred to as a known good die (KGD).

Figure 7B:
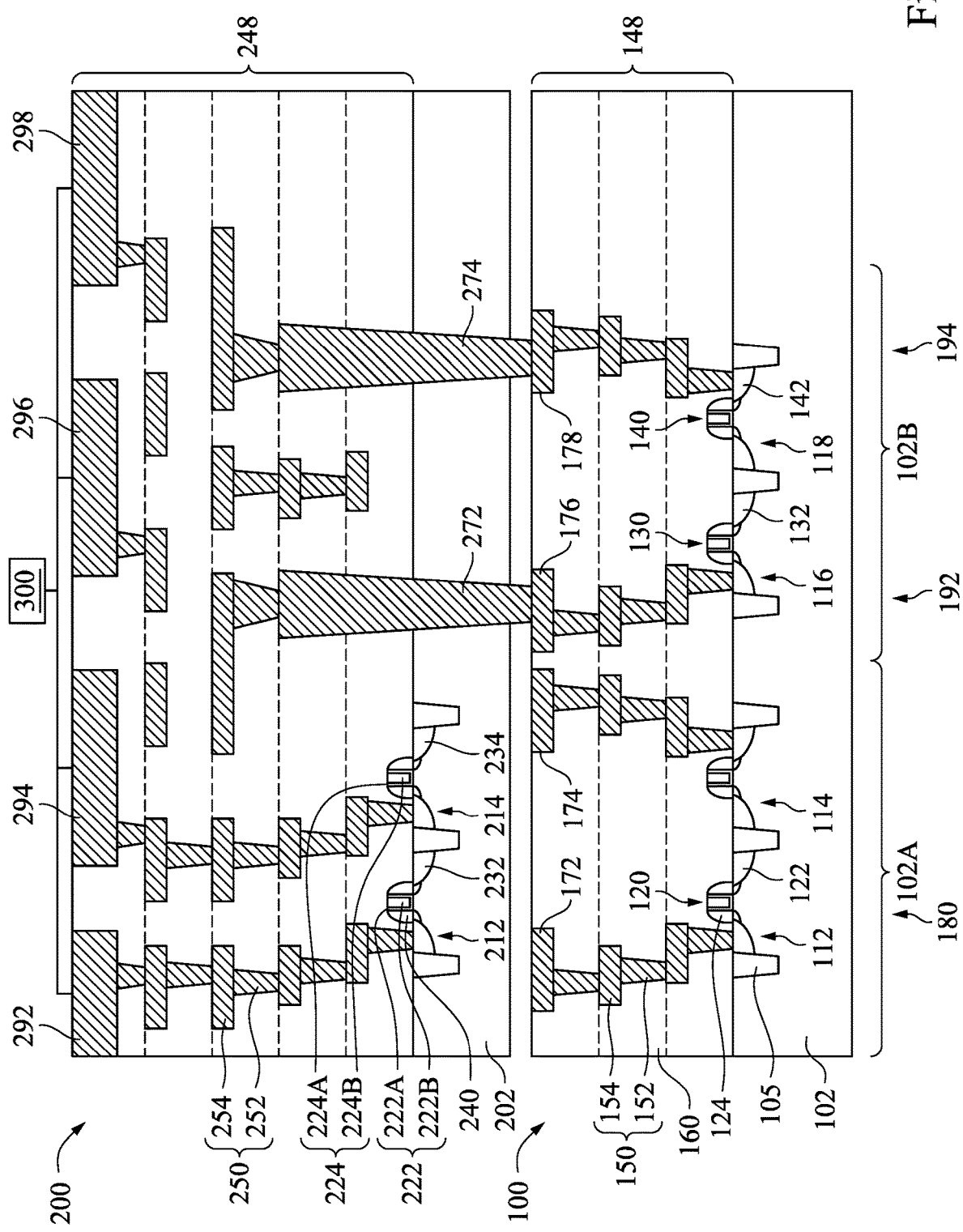
FIGS. 7B to 7D are cross-sectional views of wafers and testing modules in accordance with some embodiments of the present disclosure.

Reference is made to FIG. 7B. The topmost layer of the conductive lines 254 of the conductive features 250 in the testing module 200 may include exposed conductive pads 292, 294, 296, and 298. The conductive pads 292, 294, 296, and 298 are electrically connected to a processor 300. Accordingly, the electrical properties and/or the electrical functionalities of the testing patterns 192 and 194 may be detected by the processor 300 through the testing module 200, and the processor 300 may be configured to determine whether the electrical properties and/or the electrical functionalities of the testing patterns 192 and 194 pass the CP test. For example, if the electrical properties and/or the electrical functionalities of the testing pattern 192 (or 194) are within a predetermined value, the testing pattern 192 (or 194) may be indicated as passing the CP test, and the die region 102A including the integrated circuit 180 associated with the testing patterns 192 (and/or 194) may be indicated as passing the CP test, and may be indicated as a good die. However, if the electrical properties and/or the electrical functionalities are not within the predetermined value, the testing pattern 192 (or 194) does not pass the CP test, the die region 102A including the integrated circuit 180 associated with the testing patterns 192 (and/or 194) may be discarded or repaired.

The electrical properties and/or the electrical functionalities of the testing pattern 192 can be detected by the processor 300 through the components in the testing module

200. In some embodiments, the conductive via 272 may be electrically connected to the first semiconductor device 212 through the conductive feature 250, and the electrical signal from the testing pad 176 may be transmitted to the processor 300 through the conductive via 272, the conductive feature 250, and the first semiconductor device 212.

On the other hand, the electrical properties and/or the electrical functionalities of the testing pattern 194 can be detected by the processor 300 through the components in the testing module 200. In some embodiments, the conductive via 274 may be electrically connected to the second semiconductor device 214 through the conductive feature 250, and the electrical signal from the testing pad 178 may be transmitted to the processor 300 through the conductive via 274, the conductive feature 250, and the second semiconductor device 214.

In some embodiments, the first semiconductor device 212 and the second semiconductor device 214 can act as switches that control signal transmissions from the testing patterns 192 and 194 to the processor 300. For example, if the testing patterns 192 and 194 are associated with different semiconductor devices (or integrated circuit) in different die regions, the testing process can be performed to the testing patterns 192 and 194 individually. That is, during the processor 300 detects electrical properties and/or the electrical functionalities of the testing pattern 192, the first semiconductor device 212 is turned on, while the second semiconductor device 214 is turned off. As a result, signal transmission is allowed from the testing pad 176 of the testing pattern 192 to the processor 300 through the first semiconductor device 212. However, signal transmission is forbidden from the testing pad 178 of the testing pattern 194 to the processor 300, because the second semiconductor device 214 is turned off. Similarly, during the processor 300 detects electrical properties and/or the electrical functionalities of the testing pattern 194, the first semiconductor device 212 is turned off, while the second semiconductor device 214 is turned on, relevant details will not be repeated for brevity.

In some embodiments, the processor 300 can be general purpose processor, a digital signal processor (DSP), an application specific integrated circuit (ASIC), a field programmable gate array (FPGA) or other programmable logic device, discrete hardware components, or any combination thereof designed to perform the functions described herein. A general-purpose processor can be a microprocessor, but in the alternative, the processor can be any processor, controller, or microcontroller. A processor can also be implemented as a combination of computing devices, for example, a combination of a DSP and a microprocessor, a plurality of microprocessors, one or more microprocessors in conjunction with a DSP core, or any other such configuration.

Figure 7C:
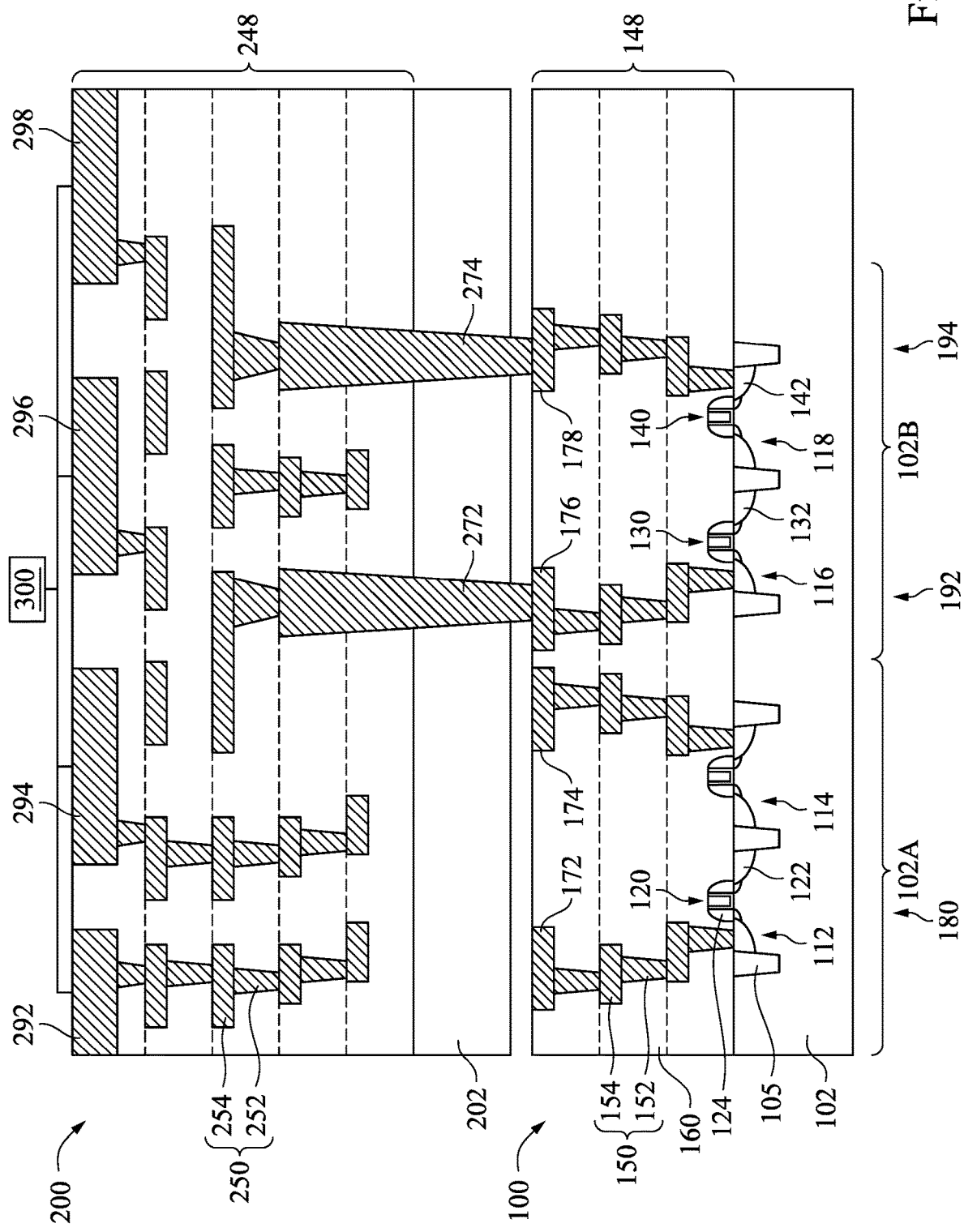
Figure 7D:
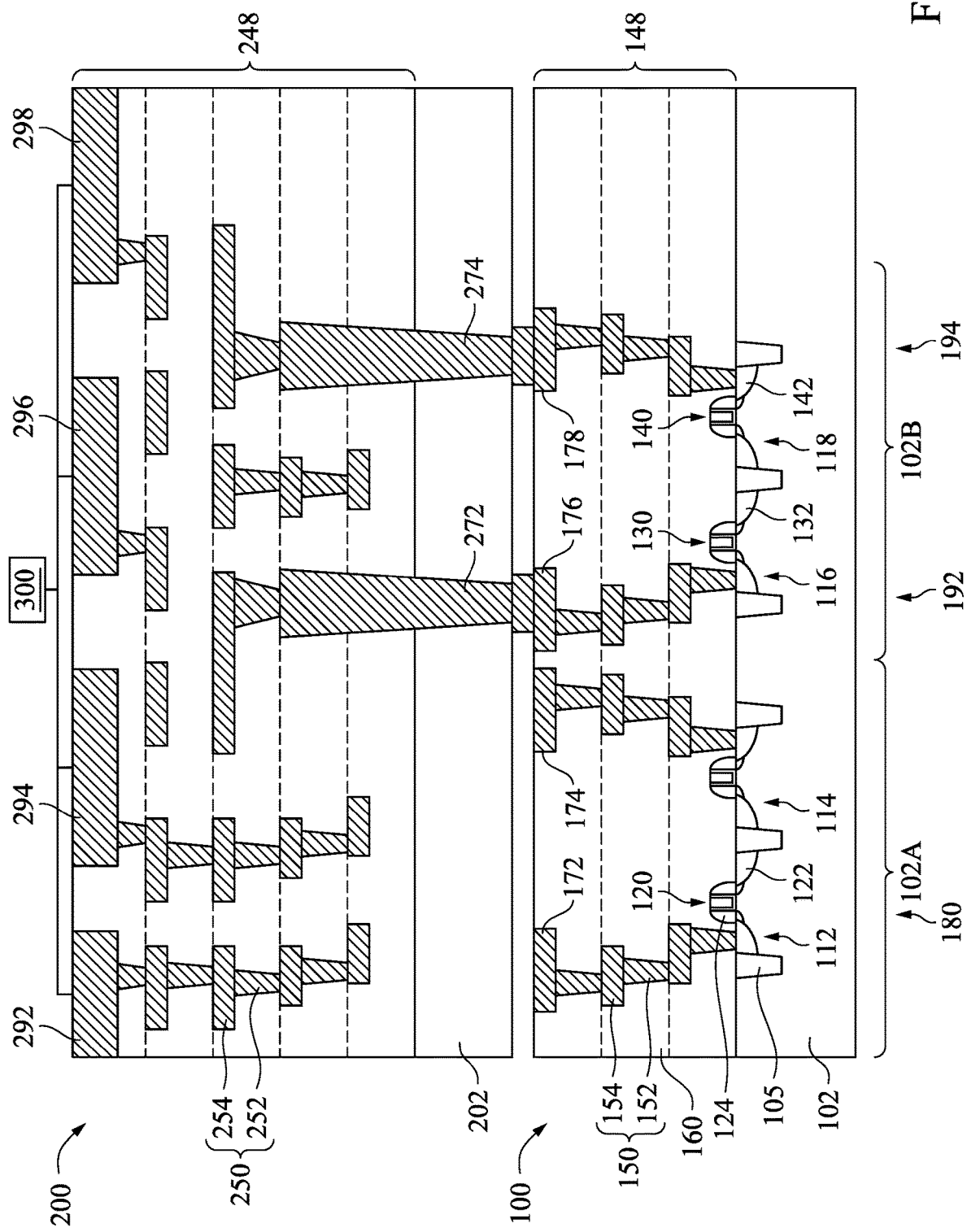

FIGS. 7C and 7D are similar to FIG. 7B, and thus relevant details will not be repeated for brevity. The difference between FIG. 7C and FIG. 7B is that the first semiconductor device 212 and the second semiconductor device 214 are omitted in FIG. 7C. The difference between FIG. 7D and FIG. 7B is that the first semiconductor device 212 and the second semiconductor device 214 are omitted in FIG. 7D, and the conductive vias 272 and 274 are electrically connected to the testing pads 176 and 178 through the conductive pads 282 and 284, respectively.

Referring back to FIG. 2, the method M1 proceeds to block S106, in which the testing module is detached from the wafer. In FIG. 8, when the testing process as discussed in FIGS. 7A to 7D is completed, the testing module 200 is detached from the wafer 10. In some embodiments, the gripper 600 may move the testing module 200 upwardly to break the electrical connection between the testing module 200 and the wafer 10. In some embodiments, the gripper 600 may move the testing module 200 to another field 12, and then performing another testing process to the die in another field 12. The above operation may be repeated until all testing targets in the fields 12 on the wafer 10 undergo the processes as discussed in blocks S102 to S106. Afterward, the gripper 600 may move the testing module 200 to a recycling area. Here, the recycling area can be a space or a container for placing a testing module 200.

Referring back to FIG. 2, the method M1 proceeds to block S107, in which a cleaning process is performed to the testing module. After performing several times of testing processes discussed above, the testing module 200 may include contaminations on exposed surface of the testing module 200. For example, the bottom surface of the substrate 202, the exposed surfaces of the conductive vias 272 and 274, or the exposed surfaces of the conductive pads 282 and 284 may include contaminations. The contaminations may deteriorate the accuracy of the testing process once the testing module 200 is used again. Accordingly, a cleaning process may be performed to remove contaminations from the bottom surface of the substrate 202, the exposed surfaces of the conductive vias 272 and 274, or the exposed surfaces of the conductive pads 282 and 284.

Figure 9:
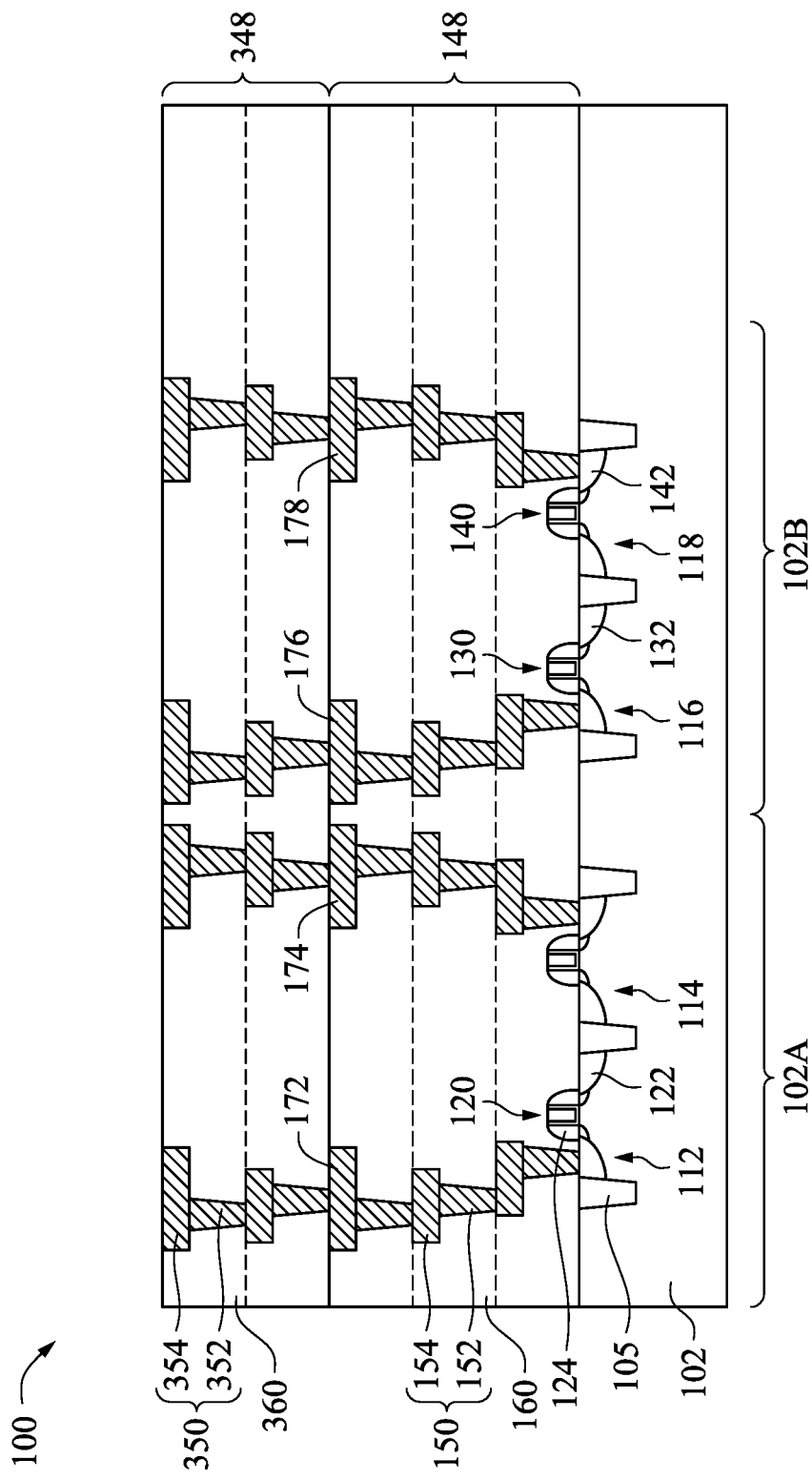
FIG. 9 is a cross-sectional view of a wafer in accordance with some embodiments of the present disclosure.

Referring back to FIG. 2, the method M1 proceeds to block S108, an interconnection structure is formed over the integrated circuit. As shown in FIG. 9, after the testing module 200 is detached from the wafer 100, an interconnection structure 348 is formed over the interconnection structure 148.

The interconnect structure 348 may include one or more layers of conductive features 350 formed in one or more stacked dielectric layers 360. Conductive features 350 may include conductive lines 354 and conductive vias 352 interconnecting the layers of conductive lines 354. The conductive vias 352 may extend through respective ones of the dielectric layers 360 to provide vertical connections between layers of conductive lines 354. The materials and formation methods of the interconnect structure 348 can be similar to the interconnect structure 148, and thus relevant details will not be repeated for brevity.

In some embodiments, the conductive features 350 of the interconnect structure 348 may be in contact with the conductive pads 172, 174, 176, and 178 of the interconnect structure 148, respectively. In greater details, the conductive features 350 may be electrically connected to the integrated circuit 180, and may be electrically connected to the semiconductor device 112 and 114.

Figure 10:
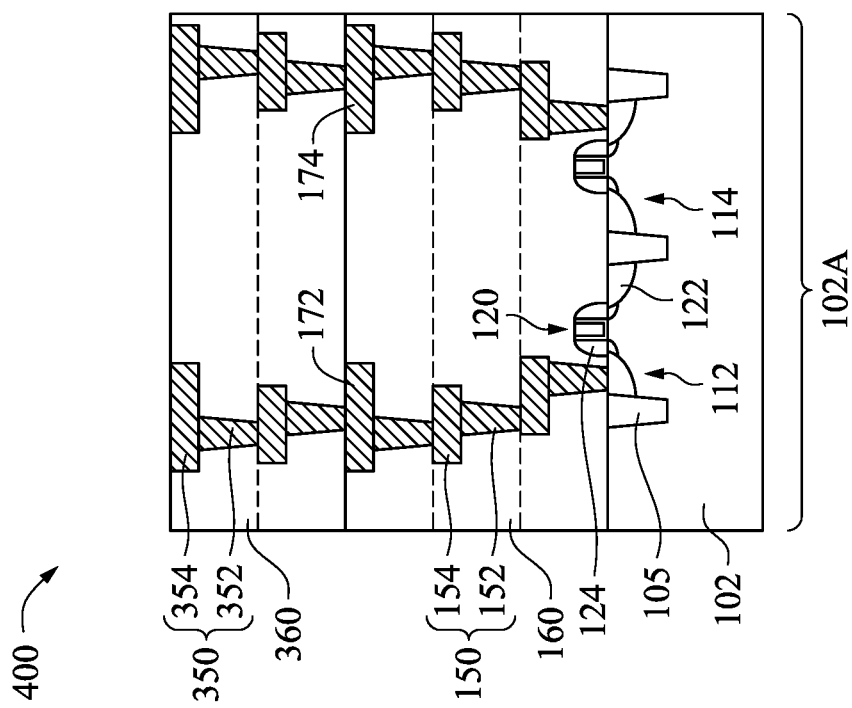
FIG. 10 is a cross-sectional view of a wafer in accordance with some embodiments of the present disclosure.

Referring back to FIG. 2, the method M1 proceeds to block S109, a singulation process is performed. In some embodiments, after the interconnect structure 348 is formed, a singulation process may be performed. The singulation process is achieved by a saw that is used to cut completely through the wafer along each of the scribe line regions (e.g., the scribe line region 102B shown in FIG. 9), and the resulting structure is shown in FIG. 10, in which the die region 102A is singulated into an individual die 400. Because testing patterns 192 and 194 are formed over scribe line region 102B (see FIG. 9), the testing patterns 192 and 194 are destroyed during the singulation process. The singulation process is a wafer dicing process including mechanical sawing, laser cutting, or a combination thereof.

According to some embodiments of the present disclosure, because the semiconductor devices become smaller and smaller, the gross die per wafer (GDPW) will increase. If the GDPW is greater than 10K, the testing process becomes an issue for smaller device. The present disclosure provides a method by performing a testing process to a wafer prior to forming a final interconnection structure, which provides an early check to the semiconductor devices over the wafer. Furthermore, the testing module used in the testing process is formed through a semiconductor fabrication process, which will also shrink the dimension of the conductive features in the testing module, and is beneficial for connecting the testing module to the testing patterns over the wafer. The present disclosure provides a robust early sanity check through the testing module and the testing process, which will reduce manufacturing cost and processing time, and will further improve the manufacturing efficiency.

FIGS. 11 to 14B are cross-sectional views of intermediate stages in the manufacturing of a testing module, in accordance with some embodiments.

Figure 11:
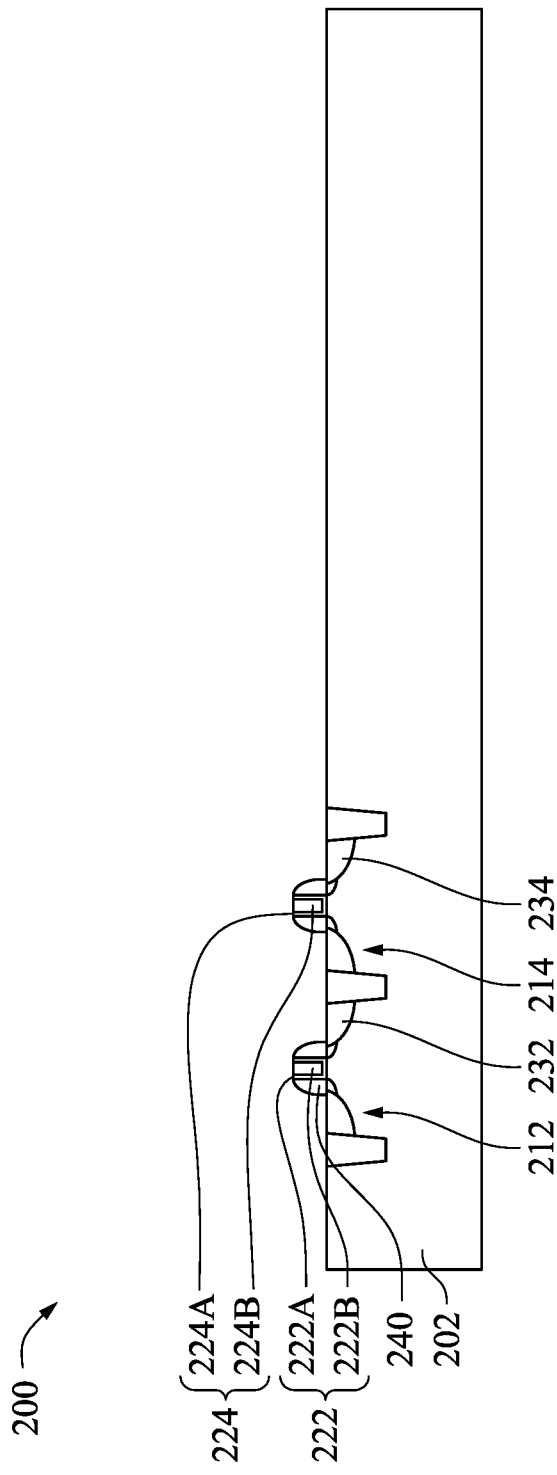
FIGS. 11 to 14B are cross-sectional views of intermediate stages in the manufacturing of a testing module, in accordance with some embodiments.

Reference is made to FIG. 11, a first semiconductor device 212 and a second semiconductor device 214 are formed over a substrate 202. In some embodiments, the semiconductor device 212 includes a gate structure 222 and source/drain regions 232 on opposite sides of the gate structure 222. On the other hand, the semiconductor device 214 includes a gate structure 224 and source/drain regions 234 on opposite sides of the gate structure 224.

In some embodiments, the gate structures 222 and 224 are high-k, metal gate (HKMG) gate structures that may be formed using a gate-last process flow. In a gate last process flow, sacrificial dummy gate structures (not shown) is formed after forming the isolation regions 105. The dummy gate structures each may include a dummy gate dielectric, a dummy gate electrode, and a hard mask. First a dummy gate dielectric material (e.g., silicon oxide, silicon nitride, or the like) may be deposited. Next a dummy gate material (e.g., amorphous silicon, polycrystalline silicon, or the like) may be deposited over the dummy gate dielectric and then planarized (e.g., by CMP). A hard mask layer (e.g., silicon nitride, silicon carbide, or the like) may be formed over the dummy gate material. The dummy gate structures are then formed by patterning the hard mask and transferring that pattern to the dummy gate dielectric and dummy gate material using suitable photolithography and etching techniques. As described in greater detail below, the dummy gate structures may be replaced by the HKMG gate structures 222 and 224, respectively. The materials used to form the dummy gate structure and hard mask may be deposited using any suitable method such as CVD, plasma-enhanced CVD (PECVD), atomic layer deposition (ALD), plasma-enhanced ALD (PEALD) or the like, or by thermal oxidation of the semiconductor surface, or combinations thereof.

Gate spacers 240 may be formed by deposition and anisotropic etch of a spacer dielectric layer performed after the dummy gate patterning is complete. The spacer dielectric layer may include one or more dielectrics, such as silicon oxide, silicon nitride, silicon oxynitride, silicon carbide, silicon carbonitride, the like, or a combination thereof. The anisotropic etch process removes the spacer dielectric layer from over the top of the dummy gate structures leaving the gate spacers 240 along the sidewalls of the dummy gate structures.

After the source and drain regions 232 and 234 are formed, dummy gate structures may be replaced with gate structures 222 and 224. For example, the dummy gate structures may be removed by etching process to form gate trenches between gate spacers 240. Then, gate dielectrics 222A and 224A are deposited in in the gate trenches, and gate metals 222B and 224B are deposited over the gate dielectrics 222A and 224A. Afterward, a CMP process is performed to remove excess materials of the gate dielectrics 222A and 224A and the gate metals 222B and 224B to form the gate structures 222 and 224.

Figure 12:
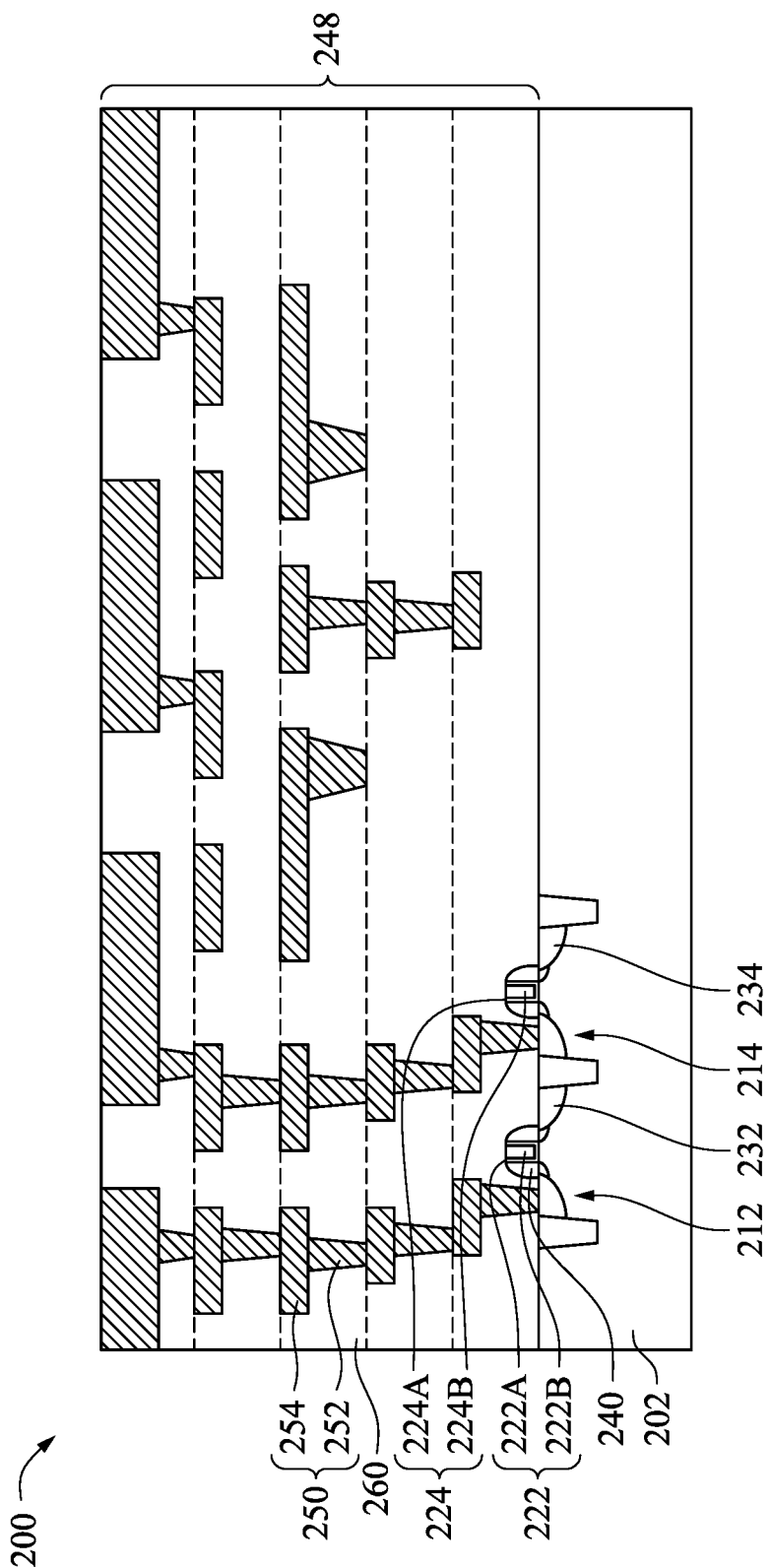

Reference is made to FIG. 12. Interconnection structure 248 is formed over the substrate 202 and over the semiconductor devices 212 and 214. The interconnect structure 148 may include one or more layers of conductive features 250 formed in one or more stacked dielectric layers 260. Each of the stacked dielectric layers 260 may include a dielectric material, such as a low-k dielectric material, an extra low-k (ELK) dielectric material, or the like. The dielectric layers 260 may be deposited using an appropriate process, such as, CVD, ALD, PVD, PECVD, or the like.

Conductive features 250 may include conductive lines 254 and conductive vias 252 interconnecting the layers of conductive lines 254. The conductive vias 252 may extend through respective ones of the dielectric layers 260 to provide vertical connections between layers of conductive lines 254. The conductive features 250 may be formed through any acceptable process, such as, a damascene process, a dual damascene process, or the like. In some embodiments, the conductive lines 254 and the conductive vias 252 may be made of Al, Si, Cu, Ti, Ta, N, O, C, Ni, Co, W, or the like.

Figure 13:
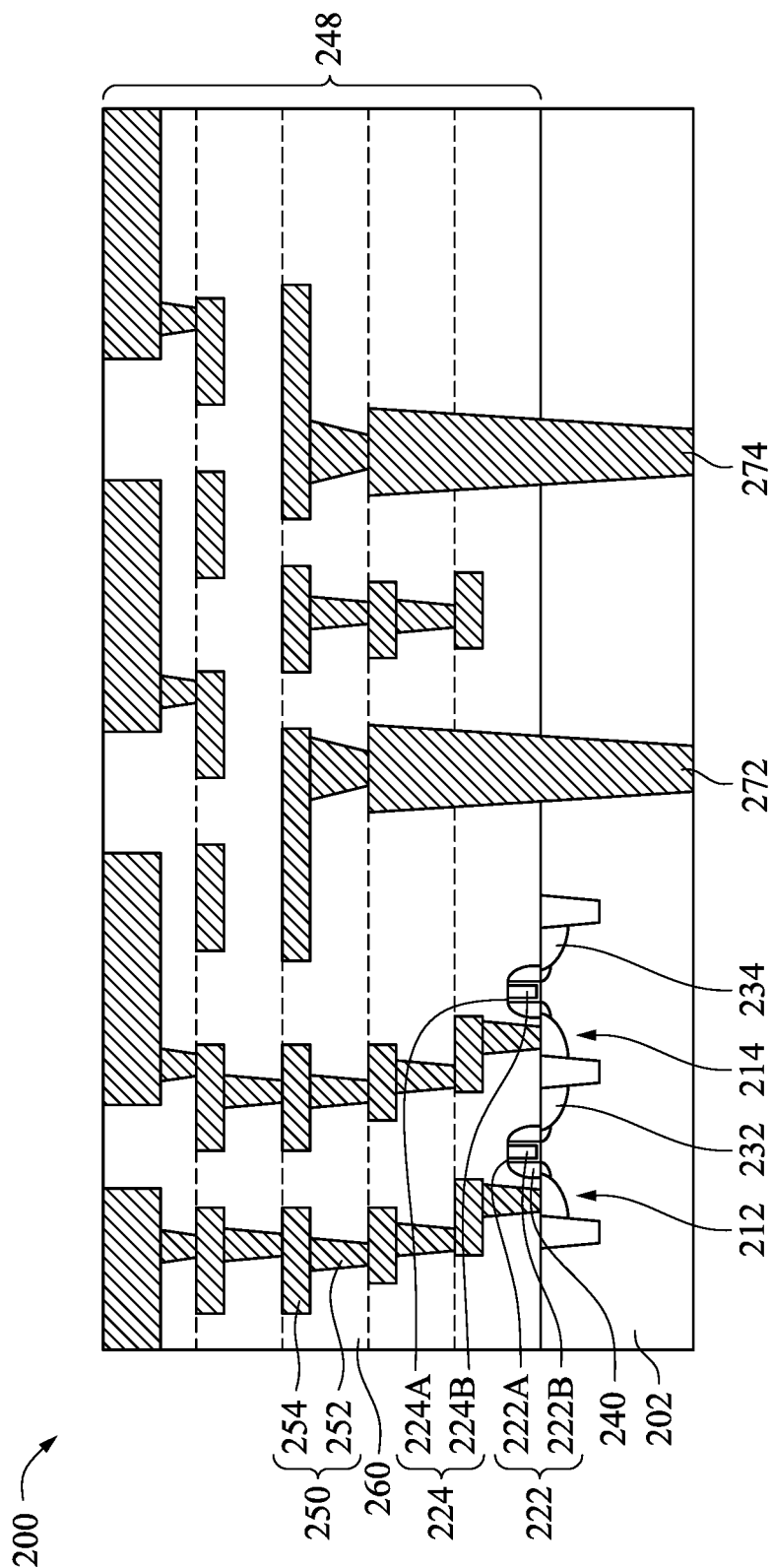

Reference is made to FIG. 13. Vias 272 and 274 are formed through the substrate 202. For example, the structure of FIG. 12 may be flipped over, and then etching the substrate 202 to form openings extending through the substrate 202 and exposing at least portions of the conductive features. Then, conductive materials, such as metal, may be deposited in the openings. Afterward, a CMP process is performed to remove excess materials of the conductive materials until the bottom surface of the substrate 202 is exposed.

Figure 14A:
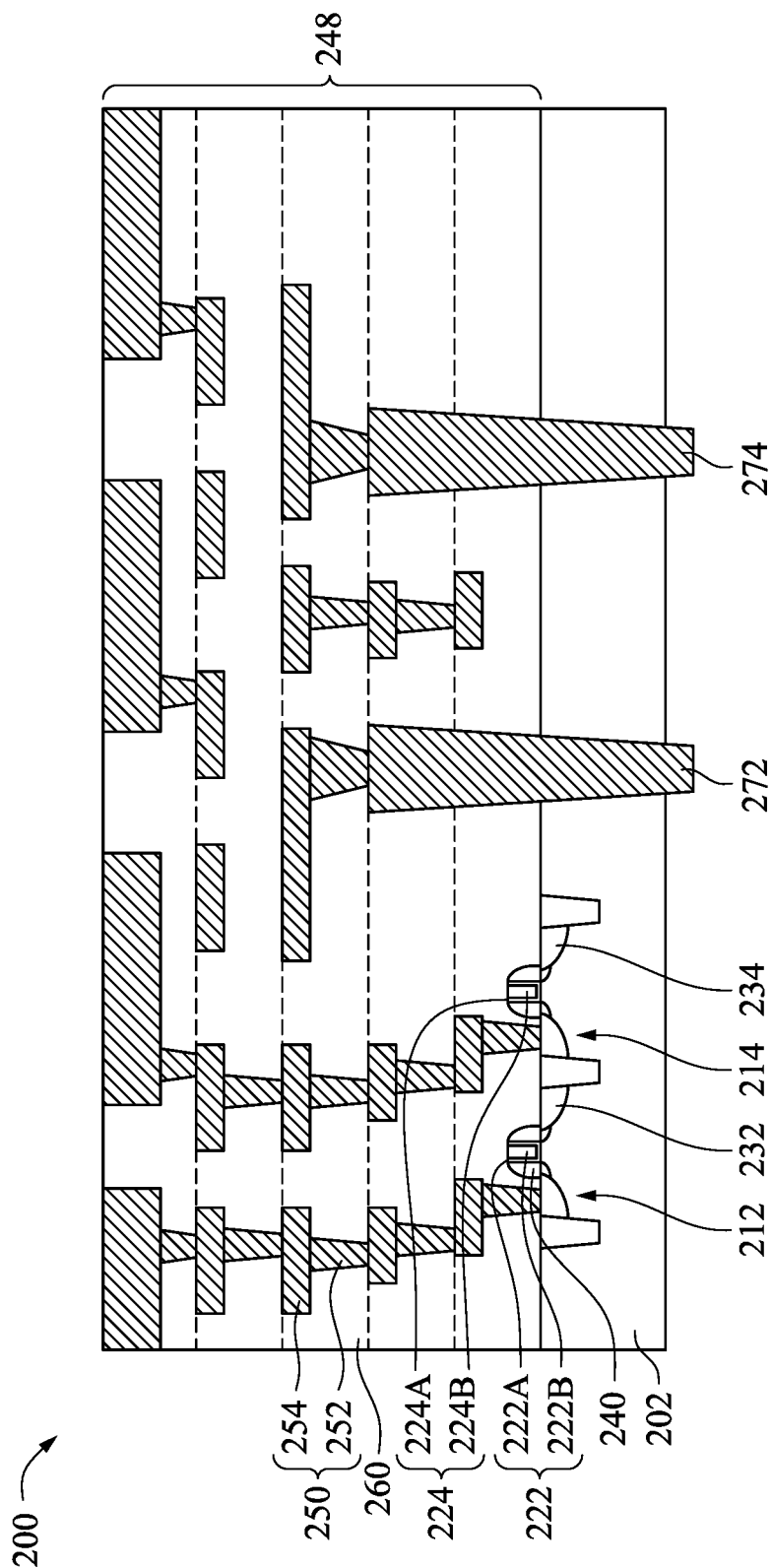

Reference is made to FIG. 14A, in which FIG. 14A illustrate a method for forming vias 272 and 274 as discussed in FIGS. 4B and 4C. After the process shown in FIG. 13 is completed, an etching back process may be performed to the substrate 202 to pull back the bottom surface of the substrate 202, such that the vias 272 and 274 protrude from the bottom surface of the substrate 202.

Figure 14B:
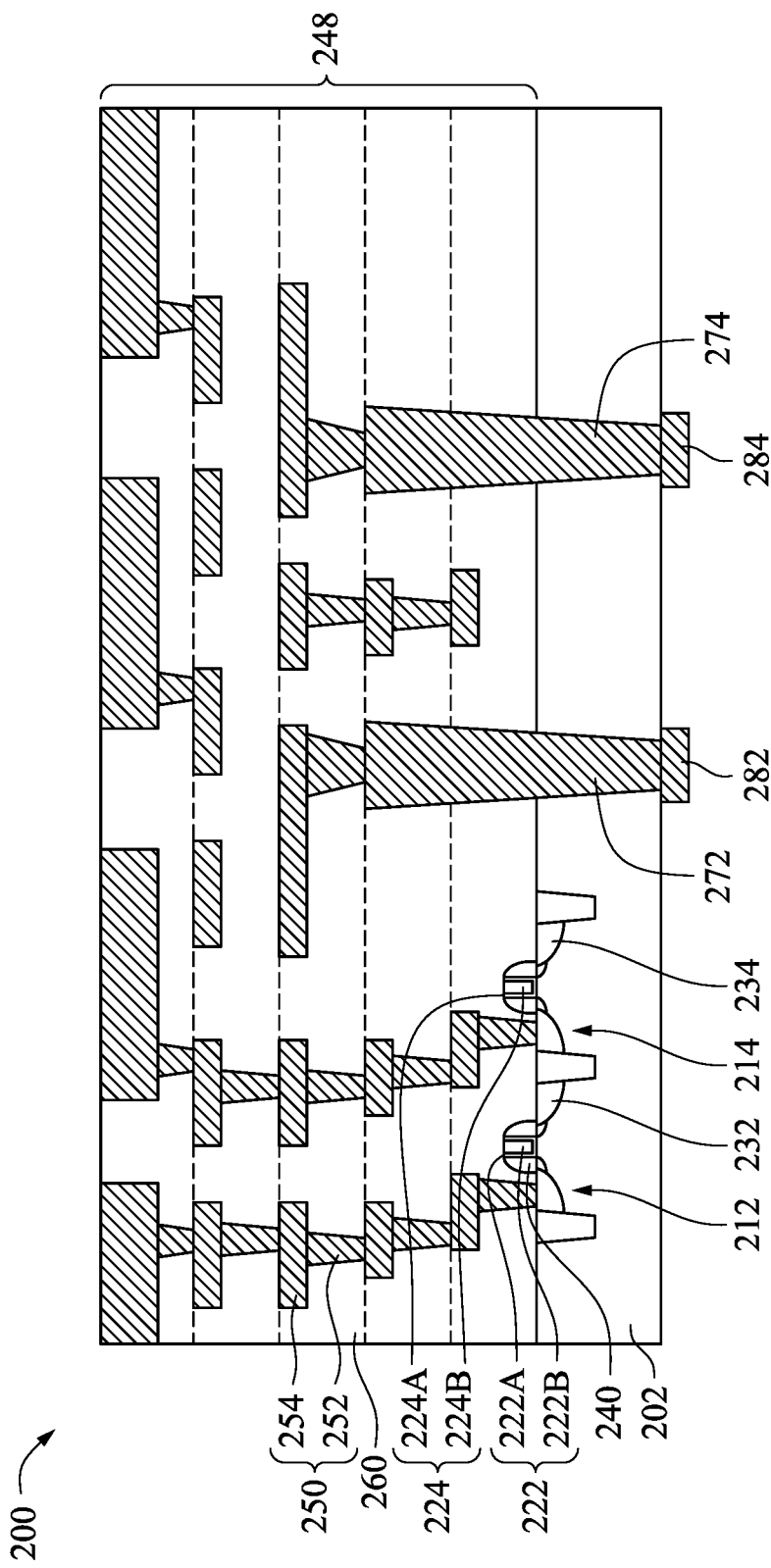

Reference is made to FIG. 14B, in which FIG. 14B illustrate a method for forming conductive pads 282 and 284 as discussed in FIG. 4D. After the process shown in FIG. 13 is completed, conductive pads 282 and 284 are formed on the bottom surface of the substrate 202, and are in contact with the vias 272 and 274, respectively. The conductive pads 282 and 284 may be formed by, for example, depositing a metal layer over the bottom surface of the substrate 202, and then patterning the metal layer to form the conductive pads 282 and 284.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the present disclosure provides a method by performing a testing process to a wafer prior to forming a final interconnection structure, which provides an early check to the semiconductor devices over the wafer. Furthermore, the testing module used in the testing process is formed through a semiconductor fabrication process, which will also shrink the dimension of the conductive features in the testing module, and is beneficial for connecting the testing module to the testing patterns over the wafer. The present disclosure provides a robust early sanity check through the testing module and the testing process, which will reduce manufacturing cost and processing time, and will further improve the manufacturing efficiency.

According to some embodiments of the present disclosure, a method includes forming an integrated circuit and a testing pattern over a die region of a wafer and a scribe line region of the wafer, respectively, in which the integrated circuit and the testing pattern are formed by a same fabrication process; connecting a via of a testing chip to a testing pad of the testing pattern; performing a testing process to the die region by detecting electrical properties of the testing pattern through the testing chip; after the testing process is completed, forming an interconnection structure over the integrated circuit, in which the interconnection structure includes conductive features electrically connected to the integrated circuit; and after the interconnection structure is formed over the integrated circuit performing an singulation process through the scribe line region of the wafer, such that the die region of the wafer is singulated into an individual die.

In some embodiments, the testing chip includes a semiconductor substrate, and the via of the testing chip extends through the semiconductor substrate and protrudes from a bottom surface of the semiconductor substrate.

In some embodiments, a top surface of the via is higher than a top surface of the semiconductor substrate.

In some embodiments, the testing chip further includes a transistor over the semiconductor substrate, and the transistor is electrically connected to the via.

In some embodiments, the method further includes performing an alignment process such that the testing chip covers an entirety of the die region of the wafer.

In some embodiments, the via of the testing chip is electrically connected to the testing pad of the testing pattern through a conductive pad in contact with a bottom surface of the testing chip.

In some embodiments, the method further includes performing a cleaning process by removing contaminations from the via of the testing chip after the testing process is completed.

According to some embodiments of the present disclosure, a method includes forming an integrated circuit and a testing pattern over a die region of a wafer and a scribe line region of the wafer, respectively, in which the integrated circuit and the testing pattern are formed simultaneously; moving a testing chip to a position above the die region and the scribe line region of the wafer, in which the testing chip includes a semiconductor substrate, a first interconnection structure over the semiconductor substrate, in which the first interconnection structure includes first conductive features, and a via extending through the semiconductor substrate and electrically connected to the first conductive features; electrically connecting the via of the testing chip to a testing pad of the testing pattern; performing a testing process to the die region by detecting electrical properties of the testing pattern through the testing chip; and after the testing process is completed, performing an singulation process through the scribe line region of the wafer, such that the die region of the wafer is singulated into an individual die.

In some embodiments, the method further includes forming a second interconnection structure over the integrated circuit after performing the testing process and prior to performing the singulation process.

In some embodiments, the testing chip is moved by a gripper.

In some embodiments, the method further includes performing a cleaning process to remove contaminations from a bottom surface of the semiconductor substrate of the testing chip and the via of the testing chip.

In some embodiments, an area of the testing chip is greater than an area of the die region of the wafer and is smaller than twice the area of the die region.

In some embodiments, the method further includes aligning the via of the testing chip with the testing pad of the testing pattern; and moving down the testing chip such that the via of the testing chip is in contact with the testing pad of the testing pattern.

In some embodiments, during performing the testing process, the testing chip covers an entirety of the die region.

According to some embodiments of the present disclosure, a method includes picking up a testing chip by a gripper, in which the testing chip includes a semiconductor substrate and first and second vias protruding from a bottom surface of the semiconductor substrate; moving the testing chip to a position over a wafer, the wafer comprising a first die region, a second die region, a scribe line region between the first die region and the second die region, and a first testing pad and a second testing pad in the scribe line region, in which the first testing pad is associated with a first semiconductor device in the first die region, and the second testing pad is associated with a second semiconductor device in the second die region; moving down the testing chip, such that the first via of the testing chip is electrically connected to the first testing pad, and a second via of the testing chip is electrically connected to the second testing pad; performing a testing process to the first and second die regions through the testing chip; and after the testing process is completed, performing a singulation process through the scribe line region of the wafer.

In some embodiments, the testing chip further includes a first transistor and a second transistor over the semiconductor substrate.

In some embodiments, the first transistor is electrically connected to the first via, and the second transistor is electrically connected to the second via, and in which during testing the first die region, the second transistor is turned off, while during testing the second die region, the first transistor is turned off.

In some embodiments, the testing chip further includes a guard ring structure laterally between the first and second vias, and a bottom surface of the guard ring structure is higher than bottom surfaces of the first and second vias.

In some embodiments, the method further includes forming an interconnection structure over the wafer after the testing process is completed and prior to performing the singulation process.

In some embodiments, the method further includes performing an alignment process such that the testing chip covers the first and second die regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming an integrated circuit and a testing pattern over a die region of a wafer and a scribe line region of the wafer, respectively, wherein the integrated circuit and the testing pattern are formed by a same fabrication process;
   connecting a via of a testing chip to a testing pad of the testing pattern;
   performing a testing process to the die region by detecting electrical properties of the testing pattern through the testing chip;
   after the testing process is completed, forming an interconnection structure over the integrated circuit, wherein the interconnection structure comprises conductive features electrically connected to the integrated circuit; and
   after the interconnection structure is formed over the integrated circuit performing an singulation process through the scribe line region of the wafer, such that the die region of the wafer is singulated into an individual die.

2. The method of claim 1, further comprising performing an alignment process such that the testing chip covers an entirety of the die region of the wafer.

3. The method of claim 1, wherein the via of the testing chip is electrically connected to the testing pad of the testing pattern through a conductive pad in contact with a bottom surface of the testing chip.

4. The method of claim 1, further comprising performing a cleaning process by removing contaminations from the via of the testing chip after the testing process is completed.

5. The method of claim 1, wherein the testing chip comprises a semiconductor substrate, and the via of the testing chip extends through the semiconductor substrate and protrudes from a bottom surface of the semiconductor substrate.

6. The method of claim 5, wherein a top surface of the via is higher than a top surface of the semiconductor substrate.

7. The method of claim 5, wherein the testing chip further comprises a transistor over the semiconductor substrate, and the transistor is electrically connected to the via.

8. A method, comprising:
   forming an integrated circuit and a testing pattern over a die region of a wafer and a scribe line region of the wafer, respectively, wherein the integrated circuit and the testing pattern are formed simultaneously;
   moving a testing chip to a position above the die region and the scribe line region of the wafer, wherein the testing chip comprises:
      a semiconductor substrate;
      a first interconnection structure over the semiconductor substrate, wherein the first interconnection structure comprises first conductive features; and
      a via extending through the semiconductor substrate and electrically connected to the first conductive features;
   electrically connecting the via of the testing chip to a testing pad of the testing pattern;
   performing a testing process to the die region by detecting electrical properties of the testing pattern through the testing chip; and
   after the testing process is completed, performing an singulation process through the scribe line region of the wafer, such that the die region of the wafer is singulated into an individual die.

9. The method of claim 8, further comprising forming a second interconnection structure over the integrated circuit after performing the testing process and prior to performing the singulation process.

10. The method of claim 8, wherein the testing chip is moved by a gripper.

11. The method of claim 8, further comprising performing a cleaning process to remove contaminations from a bottom surface of the semiconductor substrate of the testing chip and the via of the testing chip.

12. The method of claim 8, wherein an area of the testing chip is greater than an area of the die region of the wafer and is smaller than twice the area of the die region.

13. The method of claim 8, further comprising:
   aligning the via of the testing chip with the testing pad of the testing pattern; and
   moving down the testing chip such that the via of the testing chip is in contact with the testing pad of the testing pattern.

14. The method of claim 13, wherein during performing the testing process, the testing chip covers an entirety of the die region.

15. A method, comprising:
   picking up a testing chip by a gripper, wherein the testing chip comprises a semiconductor substrate and first and second vias protruding from a bottom surface of the semiconductor substrate;
   moving the testing chip to a position over a wafer, the wafer comprising a first die region, a second die region, a scribe line region between the first die region and the second die region, and a first testing pad and a second testing pad in the scribe line region, wherein the first testing pad is associated with a first semiconductor device in the first die region, and the second testing pad is associated with a second semiconductor device in the second die region;
   moving down the testing chip, such that the first via of the testing chip is electrically connected to the first testing pad, and a second via of the testing chip is electrically connected to the second testing pad;
   performing a testing process to the first and second die regions through the testing chip; and
   after the testing process is completed, performing a singulation process through the scribe line region of the wafer.

16. The method of claim 15, wherein the testing chip further comprises a guard ring structure laterally between the first and second vias, and a bottom surface of the guard ring structure is higher than bottom surfaces of the first and second vias.

17. The method of claim 15, further comprising forming an interconnection structure over the wafer after the testing process is completed and prior to performing the singulation process.

18. The method of claim 15, further comprising performing an alignment process such that the testing chip covers the first and second die regions.

19. The method of claim 15, wherein the testing chip further comprises a first transistor and a second transistor over the semiconductor substrate.

20. The method of claim 19, wherein the first transistor is electrically connected to the first via, and the second transistor is electrically connected to the second via, and wherein during testing the first die region, the second transistor is turned off, while during testing the second die region, the first transistor is turned off.

* * * * *